United States Patent
Kawamata

(10) Patent No.: US 8,921,750 B2
(45) Date of Patent: Dec. 30, 2014

(54) OPEN-CIRCUIT VOLTAGE CONTROL SYSTEM

(75) Inventor: Kenji Kawamata, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 202 days.

(21) Appl. No.: 13/183,150

(22) Filed: Jul. 14, 2011

(65) Prior Publication Data

US 2012/0043453 A1 Feb. 23, 2012

(30) Foreign Application Priority Data

Aug. 20, 2010 (JP) ................................ P2010-185569

(51) Int. Cl.
*H01L 31/05* (2014.01)
*H02J 1/00* (2006.01)
*G01R 31/40* (2014.01)

(52) U.S. Cl.
CPC .................................... *G01R 31/405* (2013.01)
USPC ............................ 250/203.4; 136/244; 307/82

(58) Field of Classification Search
CPC ...... Y02E 10/50; Y02E 10/563; H01L 31/042; H01L 31/02021; G02F 1/133
USPC .................. 250/203.1, 203.3, 203.4, 214 R; 136/244, 252, 259; 126/569, 701; 307/80, 82
See application file for complete search history.

(56) References Cited

U.S. PATENT DOCUMENTS

| 6,703,555 B2 | 3/2004 | Takabayashi et al. | |
| 2001/0032664 A1 * | 10/2001 | Takehara et al. | 136/244 |
| 2011/0184583 A1 * | 7/2011 | El-Barbari et al. | 700/297 |

FOREIGN PATENT DOCUMENTS

| JP | 2002-289891 A | 10/2002 |
| JP | 2007088280 A | * 4/2007 |

* cited by examiner

*Primary Examiner* — Kevin Pyo
(74) *Attorney, Agent, or Firm* — Baker Botts L.L.P.

(57) ABSTRACT

A system is disclosed that includes an open-circuit voltage measurement device for measuring an open-circuit voltage of a string of solar battery panels in a state where the string and a load are not connected; a drive control device for controlling an output voltage of the solar battery panels; and a calculation control device for outputting a signal for controlling the drive control device so that the open-circuit voltage attains a predetermined voltage equal to or more than an operable voltage of the load but not more than a breakdown voltage of the photovoltaic power system, based on the open-circuit voltage measured by the open-circuit voltage measurement device when the string and the load are in an open state.

11 Claims, 24 Drawing Sheets

| STATE | CASE A | CASE B |
|---|---|---|
| SUNLIGHT | 1000W/m2 | 1000W/m2 |
| DIRECTION OF SOLAR BATTERY PANEL | SOUTH | SOUTH |
| TRANSMITTED SUNLIGHT RATIO OF SUNLIGHT TRANSMISSION AMOUNT VARYING DEVICE ACCORDING TO EMBODIMENT | 100% | 10% |
| SUNLIGHT INCIDENT ONTO SOLAR BATTERY CELL | 1000W/m2 | 100W/m2 |
| CELL TEMPERATURE OF SOLAR BATTERY | -20°C | -20°C |
| OPEN-CIRCUIT VOLTAGE OF SOLAR BATTERY | 44V | 39V |
| NUMBER OF SOLAR BATTERIES CONNECTED IN SERIES PER STRING | 15modules | 15modules |
| OPEN-CIRCUIT VOLTAGE PER STRING | 660V | 585V |
| BREAKDOWN VOLTAGE OF PHOTOVOLTAIC POWER SYSTEM | 600V | 600V |
| DETERMINATION | MORE THAN BREAKDOWN VOLTAGE | LESS THAN BREAKDOWN VOLTAGE |

FIG. 6

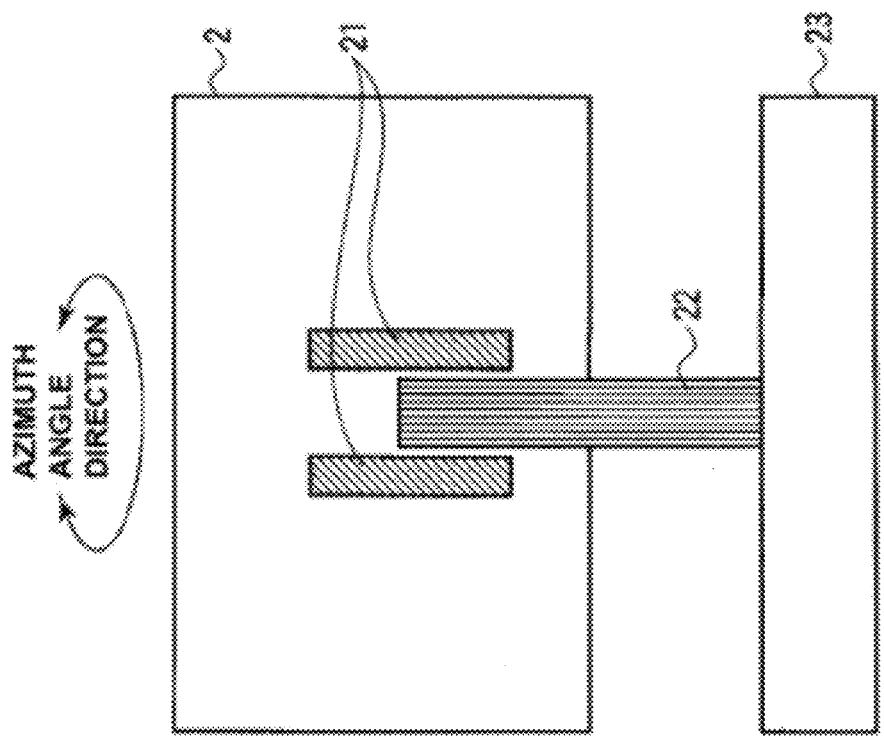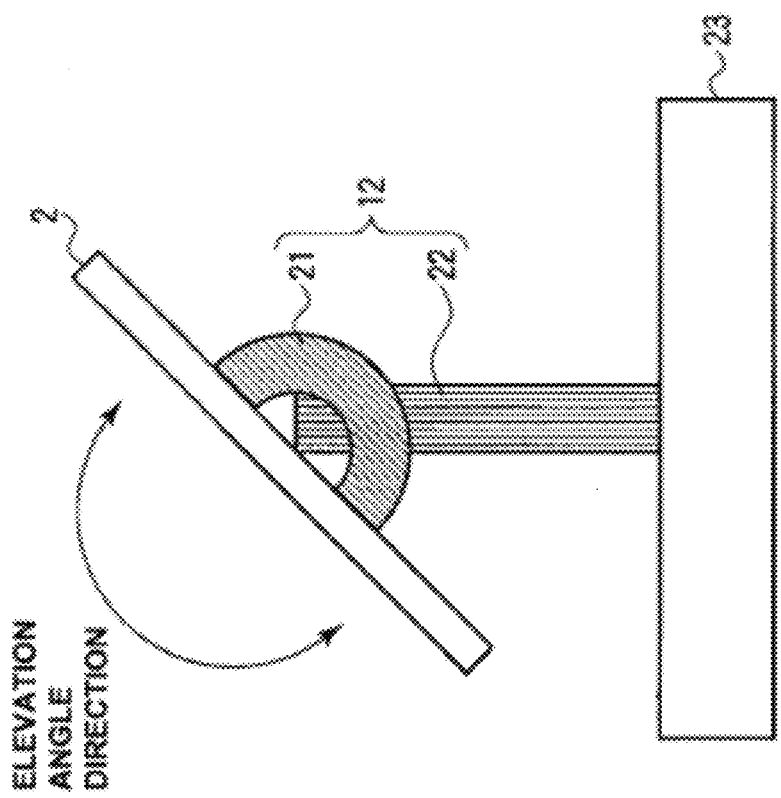
FIG. 8

FIG. 10

| STATE | CASE A | CASE O |
|---|---|---|
| SUNLIGHT | 1000W/m2 | 1000W/m2 |
| DIRECTION OF SOLAR BATTERY PANEL | DIRECTION OF SUNLIGHT | DIRECTION OPPOSITE TO DIRECTION OF SUNLIGHT |
| TRANSMITTED SUNLIGHT RATIO OF SUNLIGHT TRANSMISSION AMOUNT VARYING DEVICE ACCORDING TO EMBODIMENT | 10% | 100% |
| SUNLIGHT INCIDENT ONTO SOLAR BATTERY CELL | 1000W/m2 | 1000W/m2 |
| CELL TEMPERATURE OF SOLAR BATTERY | -20°C | -20°C |
| OPEN-CIRCUIT VOLTAGE OF SOLAR BATTERY | 44V | 39V |
| NUMBER OF SOLAR BATTERIES CONNECTED IN SERIES PER STRING | 15modules | 15modules |
| OPEN-CIRCUIT VOLTAGE PER STRING | 660V | 585V |
| BREAKDOWN VOLTAGE OF PHOTOVOLTAIC POWER SYSTEM | 600V | 600V |
| DETERMINATION | MORE THAN BREAKDOWN VOLTAGE | LESS THAN BREAKDOWN VOLTAGE |

| STATE | CASE A | CASE D |
|---|---|---|
| SUNLIGHT | 1000W/m2 | 1000W/m2 |
| DIRECTION OF SOLAR BATTERY PANEL | SOUTH | SOUTH |
| TRANSMITTED SUNLIGHT RATIO OF SUNLIGHT TRANSMISSION AMOUNT VARYING DEVICE ACCORDING TO EMBODIMENT | 100% | 100% |
| SUNLIGHT INCIDENT ONTO SOLAR BATTERY CELL | 1000W/m2 | 1000W/m2 |
| CELL TEMPERATURE OF SOLAR BATTERY | -20°C | 25°C |
| OPEN-CIRCUIT VOLTAGE OF SOLAR BATTERY | 44V | 38V |
| NUMBER OF SOLAR BATTERIES CONNECTED IN SERIES PER STRING | 15modules | 15modules |
| OPEN-CIRCUIT VOLTAGE PER STRING | 660V | 570V |
| BREAKDOWN VOLTAGE OF PHOTOVOLTAIC POWER SYSTEM | 600V | 600V |
| DETERMINATION | MORE THAN BREAKDOWN VOLTAGE | LESS THAN BREAKDOWN VOLTAGE |

FIG. 15

| STATE | CASE A | CASE E |
|---|---|---|
| SUNLIGHT | 1000W/m2 | 1000W/m2 |
| DIRECTION OF SOLAR BATTERY PANEL | SOUTH | SOUTH |
| TRANSMITTED SUNLIGHT RATIO OF SUNLIGHT TRANSMISSION AMOUNT VARYING DEVICE ACCORDING TO EMBODIMENT | 100% | 100% |
| SUNLIGHT INCIDENT ONTO SOLAR BATTERY CELL | 1000W/m2 | 1000W/m2 |
| CELL TEMPERATURE OF SOLAR BATTERY | -20°C | -20°C |
| OPEN-CIRCUIT VOLTAGE OF SOLAR BATTERY | 44V | 44V |
| NUMBER OF SOLAR BATTERIES CONNECTED IN SERIES PER STRING | 15modules | 13modules |
| OPEN-CIRCUIT VOLTAGE PER STRING | 660V | 572V |
| BREAKDOWN VOLTAGE OF PHOTOVOLTAIC POWER SYSTEM | 600V | 600V |
| DETERMINATION | MORE THAN BREAKDOWN VOLTAGE | LESS THAN BREAKDOWN VOLTAGE |

FIG. 20

| STATE | CASE 1 (SMALL AMOUNT OF SUNLIGHT) | CASE 2 (LARGE AMOUNT OF SUNLIGHT) | CASE 3 (LARGE AMOUNT OF SUNLIGHT) |
|---|---|---|---|
| SUNLIGHT INCIDENT ONTO SOLAR BATTERY | 100W/m2 | 1000W/m2 | 1000W/m2 |
| CELL TEMPERATURE OF SOLAR BATTERY | -20°C | -20°C | -20°C |
| OPEN-CIRCUIT VOLTAGE OF SOLAR BATTERY | 39V | 44V | 44V |
| NUMBER OF SOLAR BATTERIES CONNECTED IN SERIES PER STRING | 15modules | 15modules | 13modules |
| OPEN-CIRCUIT VOLTAGE PER STRING | 585V | 660V | 572V |
| BREAKDOWN VOLTAGE OF PHOTOVOLTAIC POWER SYSTEM | 600V | 600V | 600V |
| DETERMINATION | LESS THAN BREAKDOWN VOLTAGE | MORE THAN BREAKDOWN VOLTAGE | LESS THAN BREAKDOWN VOLTAGE |
| POWER GENERATION CAPACITY PER SOLAR BATTERY PANEL | — | 200W | 200W |
| POWER GENERATION CAPACITY PER STRING | — | 3000W | 2600W |
| NUMBER OF STRINGS NECESSARY TO GENERATE POWER GENERATION CAPACITY OF 39000W | — | 13 | 15 |

FIG. 22

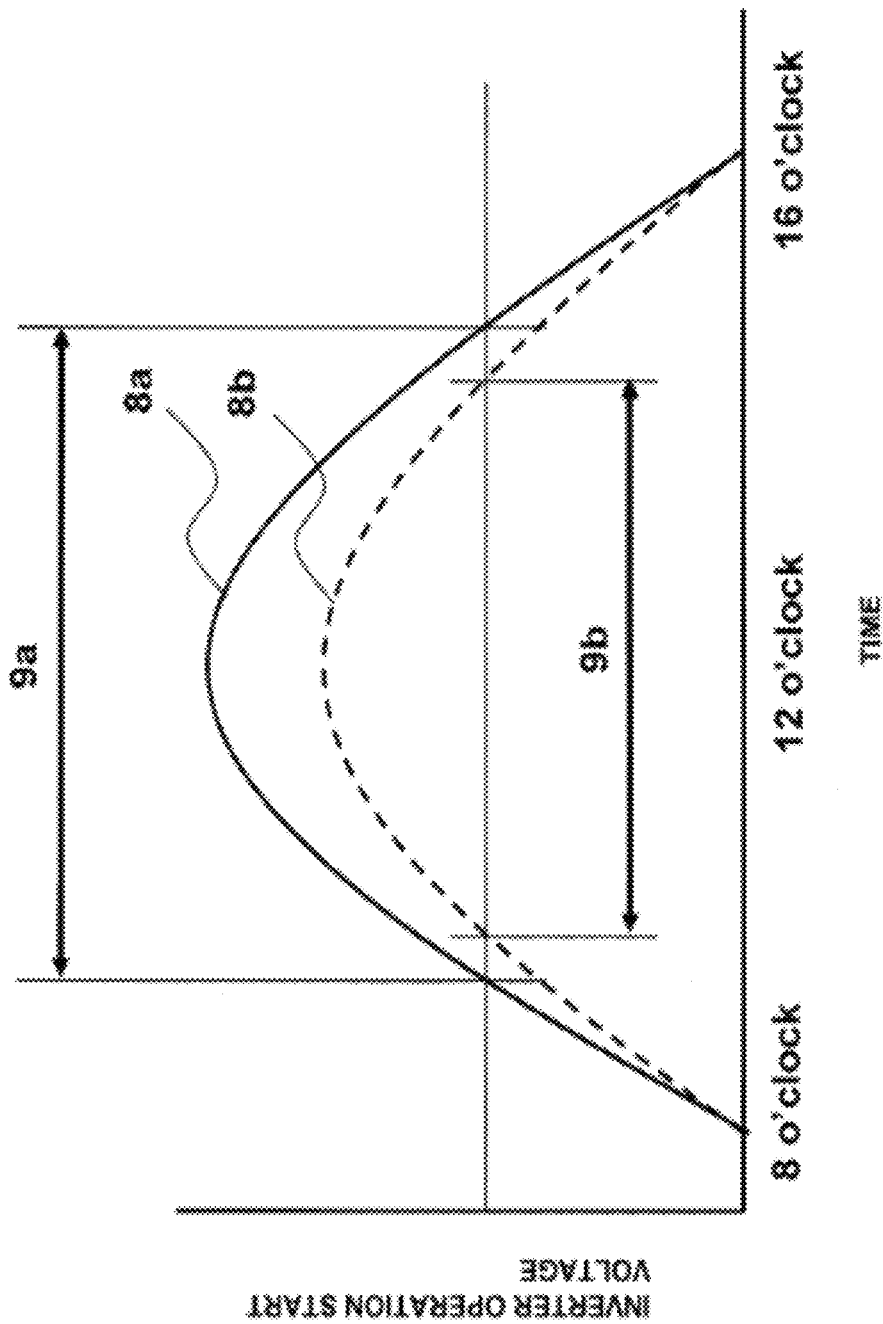

OPEN-CIRCUIT VOLTAGE CONTROL SYSTEM

CROSS-REFERENCE TO RELATED APPLICATIONS

This application is based upon and claims the benefit of priority from Japanese Patent Application No. 2010185569, filed on Aug. 20, 2010, the entire contents of which are incorporated herein by reference.

FIELD

Embodiments of the present disclosure relate to an open-circuit voltage control system used in a photovoltaic power system to control an open-circuit voltage so that the open-circuit voltage attains a desired value.

BACKGROUND

Recently, power generation systems using natural energy attract attention, and photovoltaic power systems have been actively introduced. Photovoltaic generation uses a solar battery (PV: Photovoltaic) for converting energy of sunlight into electric power. However, a solar battery panel does not satisfy an operable voltage of an inverter.

Incidentally, there are needs for an increase of the amount of power generation and a further reduction of manufacturing cost of a photovoltaic power system.

SUMMARY

In some embodiments, a system is disclosed that includes an open-circuit voltage measurement device for measuring an open-circuit voltage of a string of solar battery panels in a state where the string and a load are not connected; a drive control device for controlling an output voltage of the solar battery panels; and a calculation control device for outputting a signal for controlling the drive control device so that the open-circuit voltage attains a predetermined voltage equal to or more than an operable voltage of the load but not more than a breakdown voltage of the photovoltaic power system, based on the open-circuit voltage measured by the open-circuit voltage measurement device when the string and the load are in an open state. The drive control device can be a sunlight amount varying device for changing an amount of sunlight incident onto the solar battery panel, and the calculation control device outputs, to the sunlight amount varying device, a signal for changing the amount of sunlight so that the open-circuit voltage generated by the string attains the predetermined voltage, based on the open-circuit voltage measured by the open-circuit voltage measurement device. The drive control device can be a direction varying device for changing at least one of a direction and an inclination of the solar battery panel surface. The calculation control device can output, to the direction varying device, a signal for changing the direction and the inclination of the solar battery panel surface so that the open-circuit voltage generated by the string attains the predetermined voltage, in view of a relationship between the direction of the sunlight and the open-circuit voltage based on the open-circuit voltage measured by the open-circuit voltage measurement device. Embodiments can also include a thermometer for measuring a temperature of the solar battery panel, wherein the drive control device is a temperature varying device for changing the temperature of the solar battery panel, and the calculation control device outputs, to the temperature varying device, a signal for changing a cell temperature so that the open-circuit voltage generated by the string attains the predetermined voltage, in view of a relationship between the cell temperature and the open-circuit voltage based on the open-circuit voltage measured by the open-circuit voltage measurement device. The drive control device can be a circuit varying device for changing a number of the plurality of solar battery panels connected in series, and the calculation control device can output, to the circuit varying device, a signal for changing the number of solar battery panels so that the open-circuit voltage generated by the string attains the predetermined voltage equal to or more than the operable voltage of the load but not more than the breakdown voltage of the photovoltaic power system, in view of a relationship between the number of solar battery panels connected in series and the open-circuit voltage based on the open-circuit voltage measured by the open-circuit voltage measurement device. Some embodiments further include a thermometer for measuring a cell temperature of the solar battery panel, wherein the drive control device is a sunlight amount varying device for changing an amount of sunlight incident onto the solar battery panel, and the calculation control device outputs, to the sunlight amount varying device, a signal for changing the amount of sunlight so that the open-circuit voltage generated by the string attains the predetermined voltage, in view of a relationship between the sunlight and the open-circuit voltage at the cell temperature based on the cell temperature and the open-circuit voltage measured by the open-circuit voltage measurement device.

In other embodiments a method is disclosed that includes measuring an open-circuit voltage of a string of solar battery panels in an open state state where the string and a load are not connected; and controlling an output voltage of the solar battery panels so that the open-circuit voltage attains a predetermined voltage equal to or more than an operable voltage of the load but not more than a breakdown voltage of a photovoltaic power system, based on the measured open-circuit voltage when the string and the load are not connected. Controlling the output voltage of the solar battery panels can include changing an amount of sunlight incident onto the solar battery panels so that the open-circuit voltage generated by the string attains the predetermined voltage. Changing the amount of sunlight incident onto the solar battery panels can include changing the direction and the inclination of the solar battery panels surface in view of a predetermined relationship between the direction and inclination of the solar battery panels and the open-circuit voltage. The method can further include measuring a temperature of the solar battery panel; and changing a cell temperature so that the open-circuit voltage generated by the string attains the predetermined voltage in view of a predetermined relationship between the cell temperature and the open-circuit voltage. The method can further include changing a number of solar battery panels connected in series, so that the open-circuit voltage generated by the string attains the predetermined voltage equal to or more than the operable voltage of the load but not more than the breakdown voltage of the photovoltaic power system, in view of a predetermined relationship between the number of solar battery panels connected in series and the open-circuit voltage. The method can further include measuring a cell temperature of the solar battery panel; and changing an amount of sunlight incident onto the solar battery panel so that the open-circuit voltage generated by the string attains the predetermined voltage, in view of a predetermined relationship between the sunlight incident, the open-circuit voltage, and the cell temperature.

In other embodiments, an apparatus is disclosed that includes a voltage detector operable measuring an open-circuit voltage of a string of solar battery panels in a state where the string and a load are not connected; a drive control operable to control an output voltage of the solar battery panels so that the open-circuit voltage attains a predetermined voltage equal to or more than an operable voltage of the load but not more than a breakdown voltage of the photovoltaic power system, based on the open-circuit voltage measured by the voltage detector when the string and the load are in an open state. The drive control is further operable to change an amount of sunlight incident onto the solar battery panels so that the open-circuit voltage generated by the string attains the predetermined voltage. The drive control is further operable to change at least one of a direction and an inclination of the solar battery panel surface, and wherein the computer is further operable to output, to the drive control, a signal for changing at least the direction or the inclination of the solar battery panel surface so that the open-circuit voltage generated by the string attains the predetermined voltage, in view of a predetermined relationship between the direction of the sunlight and the open-circuit voltage. The apparatus can further include a thermometer for measuring a temperature of the solar battery panel; and wherein the drive control is further operable to change the temperature of the solar battery panel so that the open-circuit voltage generated by the string attains the predetermined voltage, in view of a predetermined relationship between the cell temperature and the open-circuit voltage. The drive control is further operable to change a number of the plurality of solar battery panels connected in series, and the drive control is further operable to change the number of solar battery panels so that the open-circuit voltage generated by the string attains the predetermined voltage equal to or more than the operable voltage of the load but not more than the breakdown voltage of the photovoltaic power system, in view of a predetermined relationship between the number of solar battery panels connected in series and the open-circuit voltage. The apparatus can also include a thermometer for measuring a cell temperature of the solar battery panel; and wherein the drive control device is further operable to change an amount of sunlight incident onto the solar battery panel so that the open-circuit voltage generated by the string attains the predetermined voltage, in view of a predetermined relationship between the sunlight and the open-circuit voltage at the cell temperature measurement location based on the cell temperature and the open-circuit voltage measured by the open-circuit voltage measurement device. The apparatus can also include a computer operable to output a signal to the drive control to control an output voltage of the solar battery panels so that the open-circuit voltage attains a predetermined voltage equal to or more than an operable voltage of the load but not more than a breakdown voltage of the photovoltaic power system, based on the open-circuit voltage measured by the voltage detector when the string and the load are in an open state.

BRIEF DESCRIPTION OF THE DRAWINGS

FIG. 6 is a figure illustrating a result obtained by applying the open-circuit voltage control system according to the first embodiment;

FIG. 8 is a side view and back view illustrating a solar battery panel direction varying device according to the second embodiment;

FIG. 10 is a figure illustrating a result obtained by applying the open-circuit voltage control system according to the second embodiment;

FIG. 15 is a figure illustrating a result obtained by applying the open-circuit voltage control system according to the third embodiment;

FIG. 20 is a figure illustrating a result obtained by applying the open-circuit voltage control system according to the fourth embodiment;

FIG. 22 is a figure illustrating the number of connected solar battery panels per string in the photovoltaic power system;

FIG. 23 is a schematic view illustrating a string voltage and an inverter operation time of the photovoltaic power system.

DESCRIPTION

Before a photovoltaic power system according to the present embodiment is described, functions will be described that should be arranged on the photovoltaic power system in order to respond to the above needs.

Figure 21:
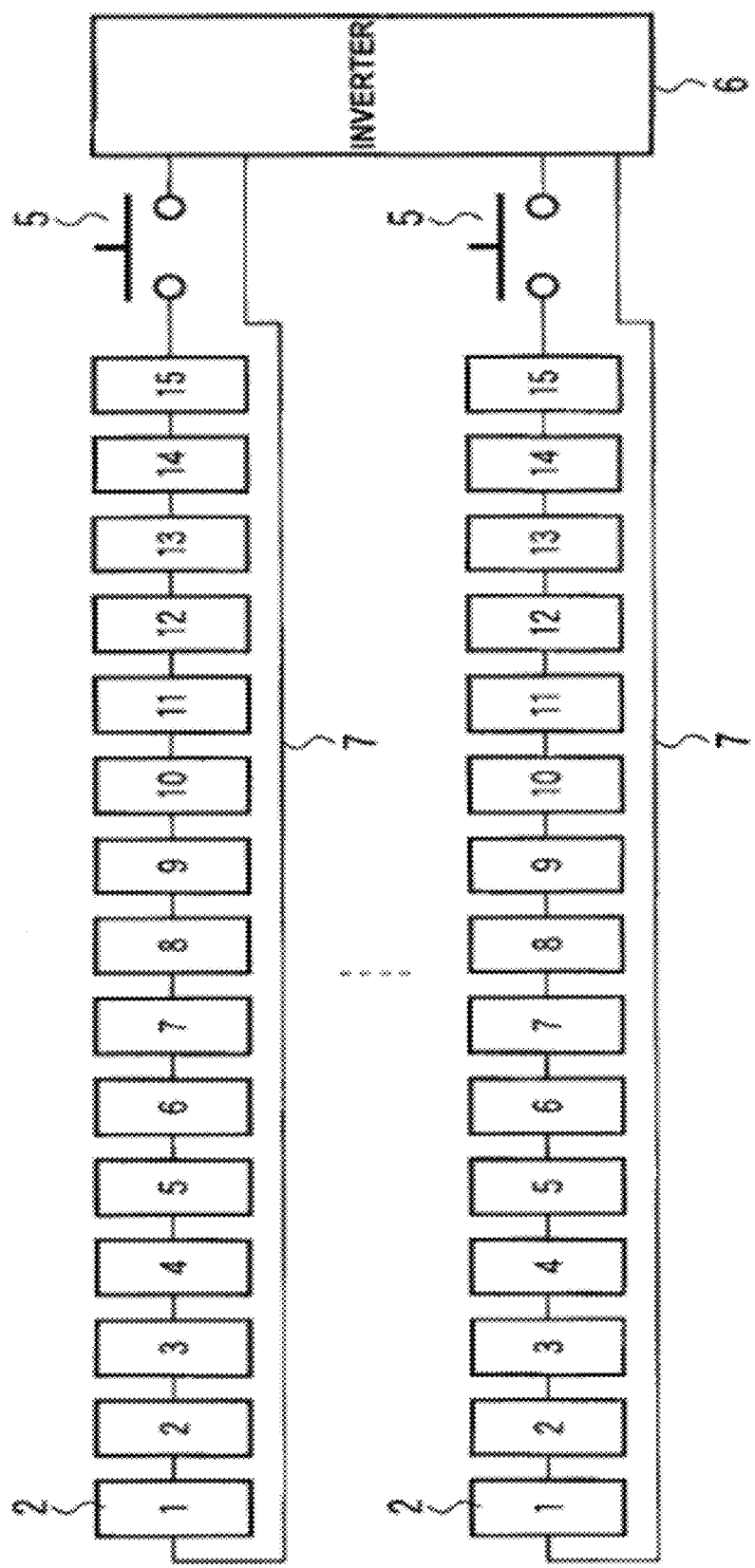
FIG. 21 is a figure illustrating a configuration of a photovoltaic power system.

FIG. 21 is a figure illustrating a configuration of a photovoltaic power system.

The photovoltaic power system includes a solar battery panel 2, a string wire 7, a switch 5, and an inverter 6.

The solar battery panels 2 are formed by arranging, for example, solar batteries (cells) having a photovoltaic effect in a planar form. The string wire 7 connects the plurality of solar battery panels 2 in series. It should be noted that a configuration of a plurality of solar battery panels 2 connected in series via the string wire 7 is referred to as one string. The inverter 6 is connected to at least one string, and converts a received direct current power of the solar battery panels 2 into an alternating current. The switch 5 connects/disconnects a power line connected to the string wire 7 and the inverter 6. The switch 5 may be incorporated into the inverter 6.

FIG. 22 is a figure for illustrating the number of connected solar battery panels per string in the photovoltaic power system.

First, major items of items arranged in a column at the left of FIG. 22 will be described. "Sunlight incident onto solar battery" represents energy (W) of sunlight per unit area ($m^2$). In this item, a small number indicates a small amount of sunlight, and a large number indicates a large amount of sunlight. "Cell temperature of solar battery" represents a temperature of a solar battery itself during use. For example, in a case of a solar battery panel manufactured with a silicon material, the voltage generated by the solar battery cell is low when the temperature of the solar battery cell is high, but the voltage generated by the solar battery cell is high when the temperature of the solar battery cell is low. The open-circuit voltage of the solar battery is mainly controlled by "sunlight incident onto solar battery" and "cell temperature of solar battery." "Open-circuit voltage of solar battery" is an output voltage of a solar battery cell when no load is connected to the solar battery cell.

The breakdown voltage of the photovoltaic power system is assumed to be 600 V. In this case, the breakdown voltage is a value determined as the upper limit value of the generated voltage in each string. When the generated voltage per string exceeds this breakdown voltage, a constituent portion of the photovoltaic power system is damaged, even though gradually. Accordingly, the photovoltaic power system is required to be designed not to exceed this breakdown voltage.

In a case 1 in which the sunlight incident onto the solar battery is 100 W/$m^2$, the number of solar batteries connected in series per string is 15 modules. Therefore, the open-circuit voltage per string is 15×39=585 V, which is less than the breakdown voltage of 600 V. In a case 2 in which the sunlight incident onto the solar battery is 1000 W/$m^2$, the number of solar batteries connected in series per string is 15 modules. Therefore, the open-circuit voltage per string is 15×44=660 V, which is more than the breakdown voltage of 600 V.

A case 3 represents a configuration for avoiding a breakdown voltage-exceeding state as described above. In the case 3, the number of connected solar batteries per string is 13 modules. Accordingly, when the sunlight incident onto the solar battery is 1000 W/$m^2$, the open-circuit voltage is 13×44=572 V, which is less than the breakdown voltage of 600 V. As illustrated in the case 3, the number of solar batteries connected in series per string is determined (reduced) according to an environment in which the photovoltaic power system is installed, so that the open-circuit voltage can be maintained below the breakdown voltage.

However, when this measure is taken, the power generation capacity per string in the case 2 is 200×15=3000 W, and the power generation capacity per string in the case 3 is 200×13=2600 W, which is smaller. Therefore, in the case 2, the number of strings necessary to obtain a power generation of 39000 W is 39000/3000=13 strings. In the case 3, the number of strings necessary to obtain 39000 W increases to 39000/2600=15 strings. A larger number of strings results in a larger number of string wires, which increases the manufacturing cost of the photovoltaic power system.

FIG. 23 is a schematic view illustrating a string voltage 8 and an inverter operation time 9 of the photovoltaic power system. The string voltage 8 is a generated voltage (open-circuit voltage) per string. The inverter 6 starts an operation when the string voltage 8 exceeds an inverter operation start voltage, and stops an operation when the string voltage 8 becomes less than the inverter operation start voltage.

In the graph illustrated in FIG. 23, the string voltages 8 (8a, 8b) begin to increase as soon as the sun rises. When the string voltages 8 (8a, 8b) exceed a certain value, the inverter 6 automatically starts an operation. Then, when the sun sets, and the string voltages 8 (8a, 8b) becomes equal to or less than the certain value, the inverter 6 automatically stops an operation. As illustrated in FIG. 23, an inverter operation time 9b, in which the number of solar batteries connected in series per string is small, is shorter than an inverter operation time 9a, in which the number of solar batteries connected in series per string is large. Therefore, the amount of power generation, in which the number of solar batteries connected in series per string is small, is less than the amount of power generation, in which the number of solar batteries connected in series per string is large.

As described above, in the photovoltaic power system, when the number of solar battery panels connected in series is limited, the manufacturing cost increases, and the amount of power generation decreases. Therefore, if the number of solar battery panels per string can be increased as compared with conventional examples, or if a reduction in the number of solar battery panels can be limited, the cost can be reduced by reducing the number of strings, and further, the amount of power generation can be increased.

The open-circuit voltage control system according to the present embodiment is conceived of as a result of repeatedly considering the above technical issues. Hereinafter, the open-circuit voltage control system according to the present embodiment will be described with reference to the drawings.

First Embodiment

Figure 1:
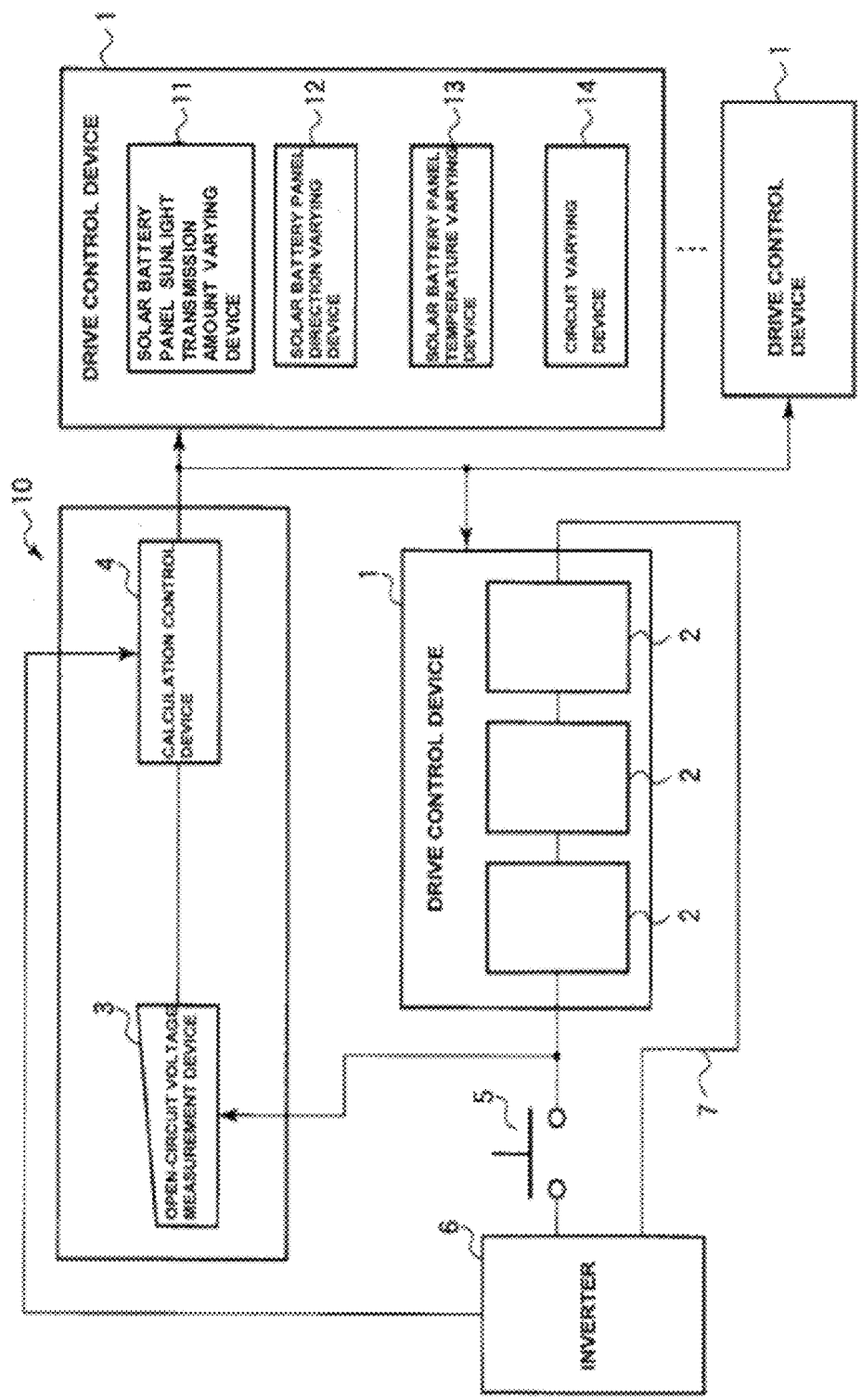
FIG. 1 is a figure illustrating a configuration of an open-circuit voltage control system according to the present disclosure.

FIG. 1 is a figure illustrating a configuration of an open-circuit voltage control system 10 according to the present embodiment. The open-circuit voltage control system 10 includes an open-circuit voltage measurement device 3, a calculation control device 4, and a drive control device 1. The open-circuit voltage measurement device 3 measures a string voltage, i.e., an open-circuit voltage, in a state where no load is applied. The calculation control device 4 exchanges a signal with an inverter 6, and controls the drive control device 1 upon receiving a measurement signal transmitted from the open-circuit voltage measurement device 3. The drive control device 1 controls the string voltage by driving a solar battery panel 2 and the like.

The drive control device 1 can include at least one of a solar battery panel sunlight transmission amount varying device 11, a solar battery panel direction varying device 12, a solar battery panel temperature varying device 13, and a circuit varying device 14.

As illustrated in FIG. 21, a plurality of strings can be connected to the inverter 6, but the open-circuit voltage measurement device 3 and the calculation control device 4 are structured as devices common to the plurality of strings, and the drive control device 1 is structured for each string. However, the open-circuit voltage measurement device 3, the calculation control device 4, and the drive control device 1 are not limited to this embodiment, and can be structured as various aspects. For example, the open-circuit voltage measurement device 3 or the calculation control device 4 may be arranged in each string. Alternatively, the drive control device 1 may be arranged as a device common to the strings.

In the first embodiment, the solar battery panel sunlight transmission amount varying device 11 is used as the drive control device 1, and the open-circuit voltage is adjusted by varying the amount of transmitted sunlight.

Figure 2:
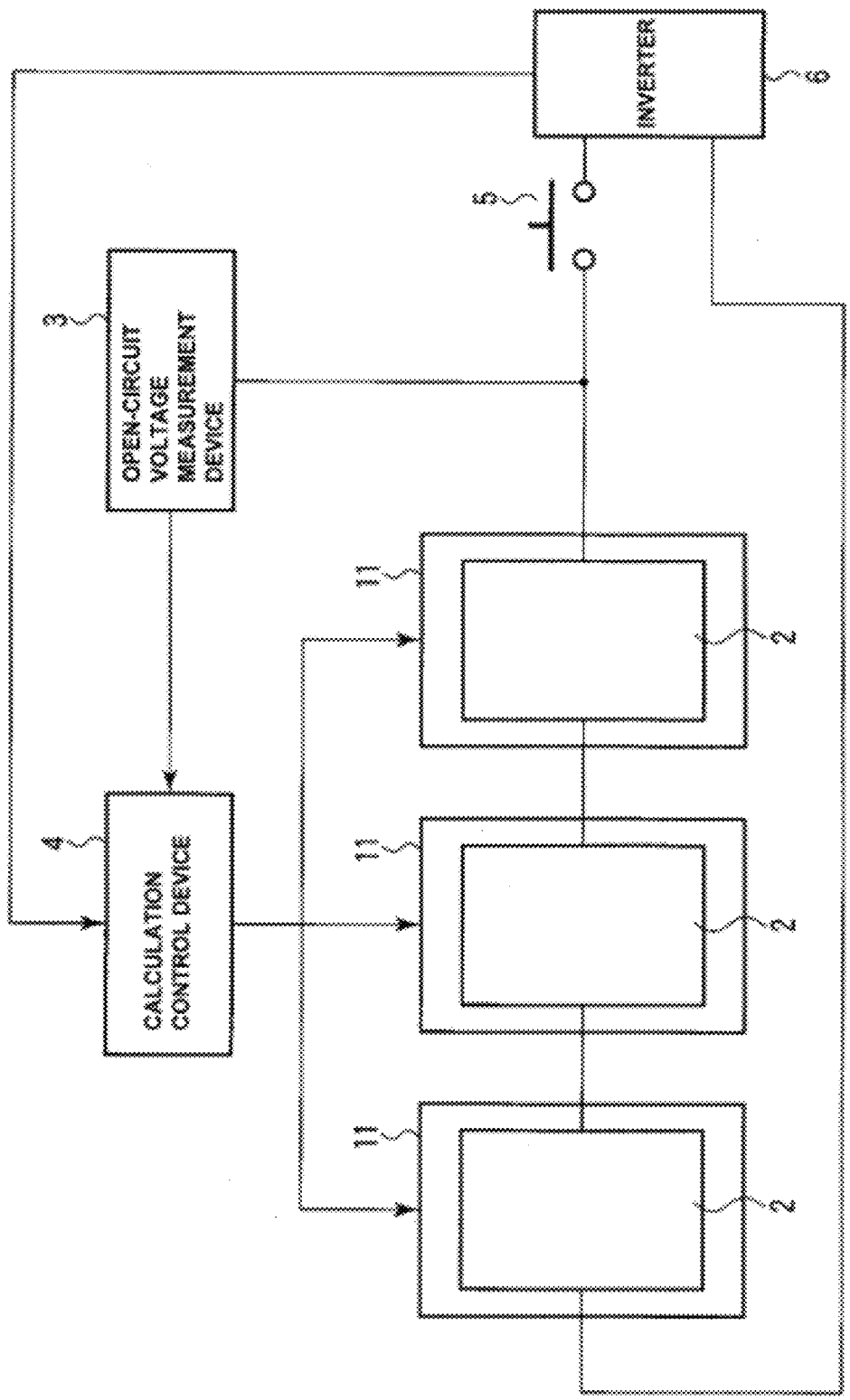
FIG. 2 is a figure illustrating a photovoltaic power system using an open-circuit voltage control system according to the first embodiment.

FIG. 2 is a figure illustrating a photovoltaic power system using an open-circuit voltage control system 10 according to the first embodiment. The photovoltaic power system includes the solar battery panel 2, the open-circuit voltage measurement device 3, the calculation control device 4, the solar battery panel sunlight transmission amount varying device 11, a switch 5, and an inverter 6. The solar battery panel sunlight transmission amount varying device 11 is arranged between the sunlight and the solar battery panel 2 to adjust the amount of sunlight passing through the solar battery panel sunlight transmission amount varying device 11. Description about devices other than the solar battery panel sunlight transmission amount varying device 11 will not be repeated.

Figure 3:
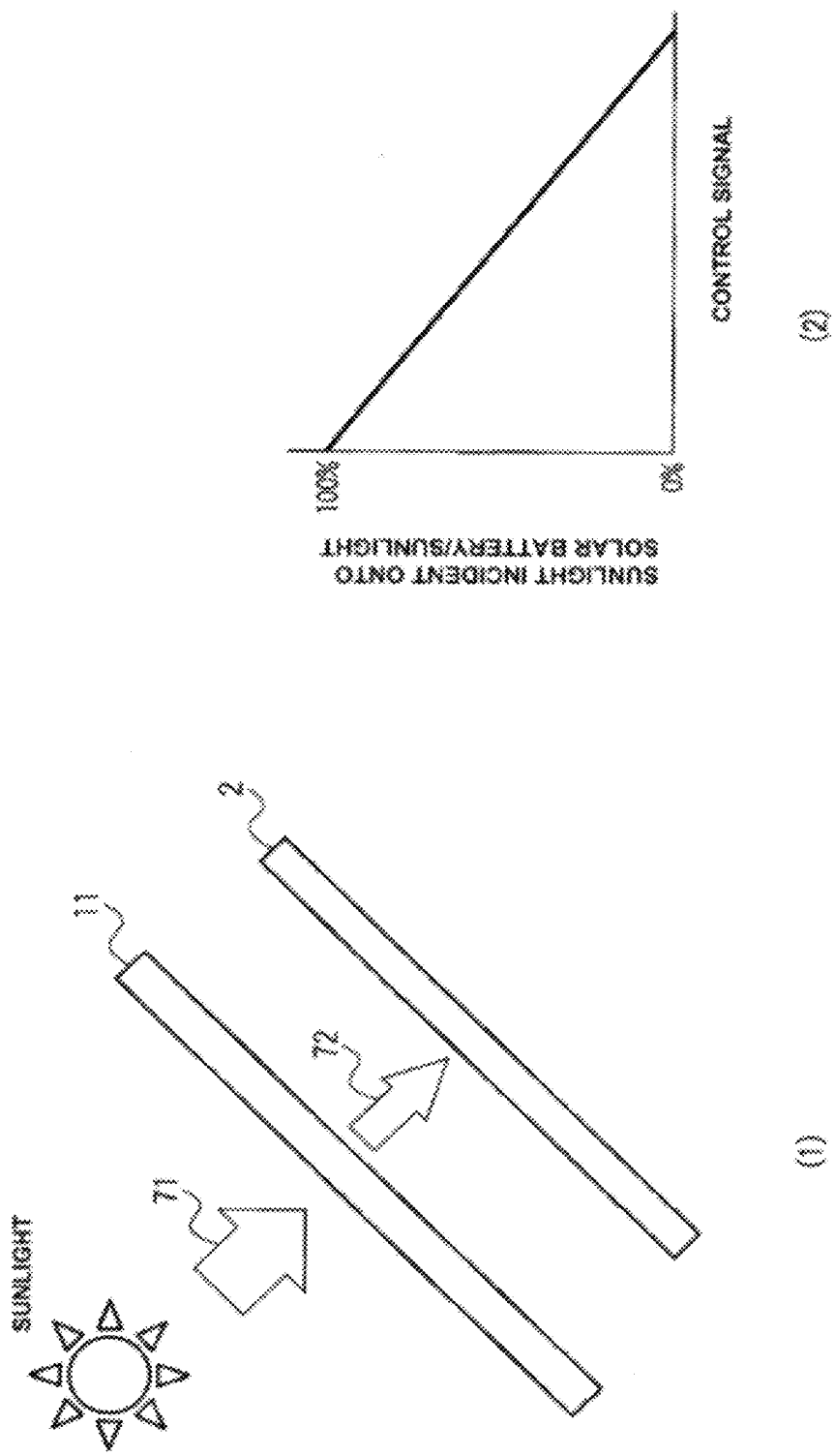
FIG. 3 is a figure illustrating operation of a solar battery panel sunlight transmission amount varying device according to the first embodiment.

FIG. 3 is a figure illustrating an operation of the solar battery panel sunlight transmission amount varying device 11 according to the first embodiment. For example, as illustrated in FIG. 3(1), a liquid crystal shutter 111 is used as the solar battery panel sunlight transmission amount varying device 11, and the amount of sunlight incident onto the solar battery panel 2 can be controlled by giving a control signal for varying a transmission ratio of the liquid crystal shutter 111 as illustrated in FIG. 3(2). Alternatively, a unit for changing an area of aperture may be used as a unit for changing the amount of transmitted sunlight. For example, a shielding member such as a sunblind may be installed instead of the liquid crystal shutter 111, and the amount of transmitted sunlight may be adjusted by varying the area of shield of the shielding member.

Figure 4:
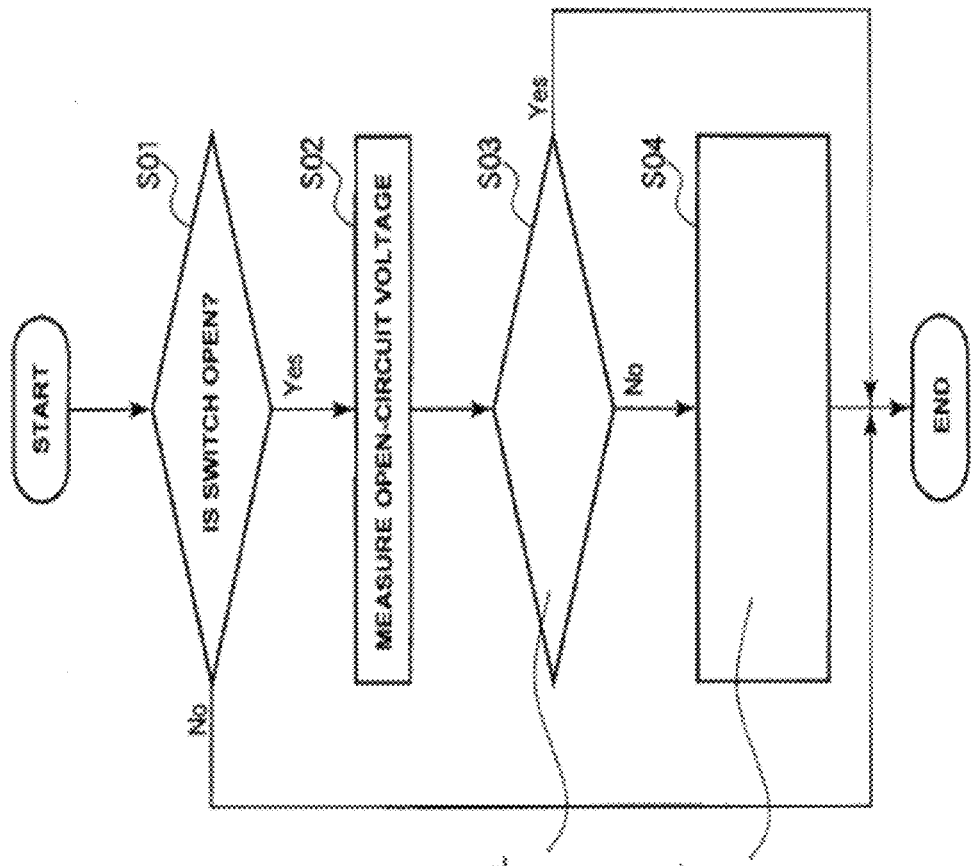
FIG. 4 is a flowchart illustrating an overview of a procedure of processing performed by a calculation control device according to the first embodiment.

FIG. 4 is a flowchart illustrating an overview of a procedure of processing performed by a calculation control device 4 according to the first embodiment. The calculation control device 4 executes the operation as illustrated in this flowchart with a predetermined interval.

In step S01, the calculation control device 4 determines whether the switch 5 is open based on a signal given by the inverter 6. As described above, the inverter 6 starts an operation when the string voltage 8 exceeds the inverter operation start voltage. In other words, when the string voltage 8 exceeds the inverter operation start voltage, the inverter 6 turns on the switch 5 to receive the string voltage 8 into a conversion circuit in the inverter 6. Therefore, the ON/OFF state of the switch 5 is controlled by the inverter 6.

When the switch 5 is closed (No in step S01), the calculation control device 4 terminates the operation. When the switch 5 is open (Yes in step S01), the calculation control device 4 receives the open-circuit voltage measured by the open-circuit voltage measurement device 3 in step S02.

In step S03, the calculation control device 4 checks whether the open-circuit voltage is equal to or less than a predetermined voltage. In this case, the predetermined voltage is equal to or more than a voltage at which the load of the inverter 6 can operate but is less than the breakdown voltage of the photovoltaic power system, the details of which will be described below. When the open-circuit voltage is equal to or less than the predetermined voltage (Yes in step S03), the calculation control device 4 terminates the operation. When the open-circuit voltage exceeds the predetermined voltage (No in step S03), the calculation control device 4 changes the degree of opening of the solar battery panel sunlight transmission amount varying device 11 so that the open-circuit voltage attains the predetermined voltage in step S04.

Figure 5:
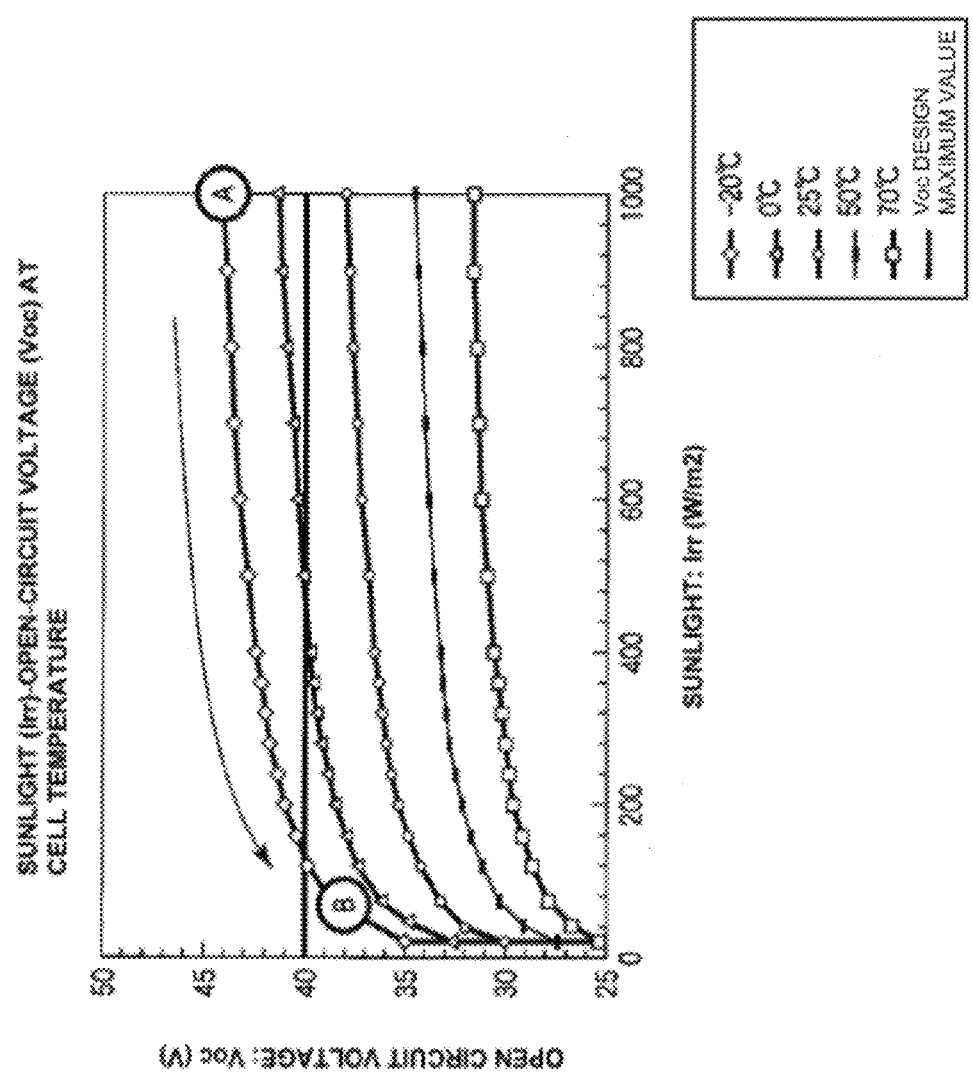
FIG. 5 is a graph illustrating a relationship between an open-circuit voltage and the amount of sunlight at each cell temperature of a solar battery panel.

FIG. 5 is a graph illustrating a relationship between an open-circuit voltage and the amount of sunlight at each cell temperature of the solar battery panel. As illustrated in this graph, the open-circuit voltage decreases as the amount of sunlight decreases. On the other hand, the open-circuit voltage decreases as the cell temperature increases. In the graph, the cell voltage value corresponding to the breakdown voltage value of the open-circuit voltage is represented as 40 V.

Now, the meaning of this control method will be described. The output voltage of the solar battery panel 2 is considered to change as follows after the sun rises.

Figure 24:
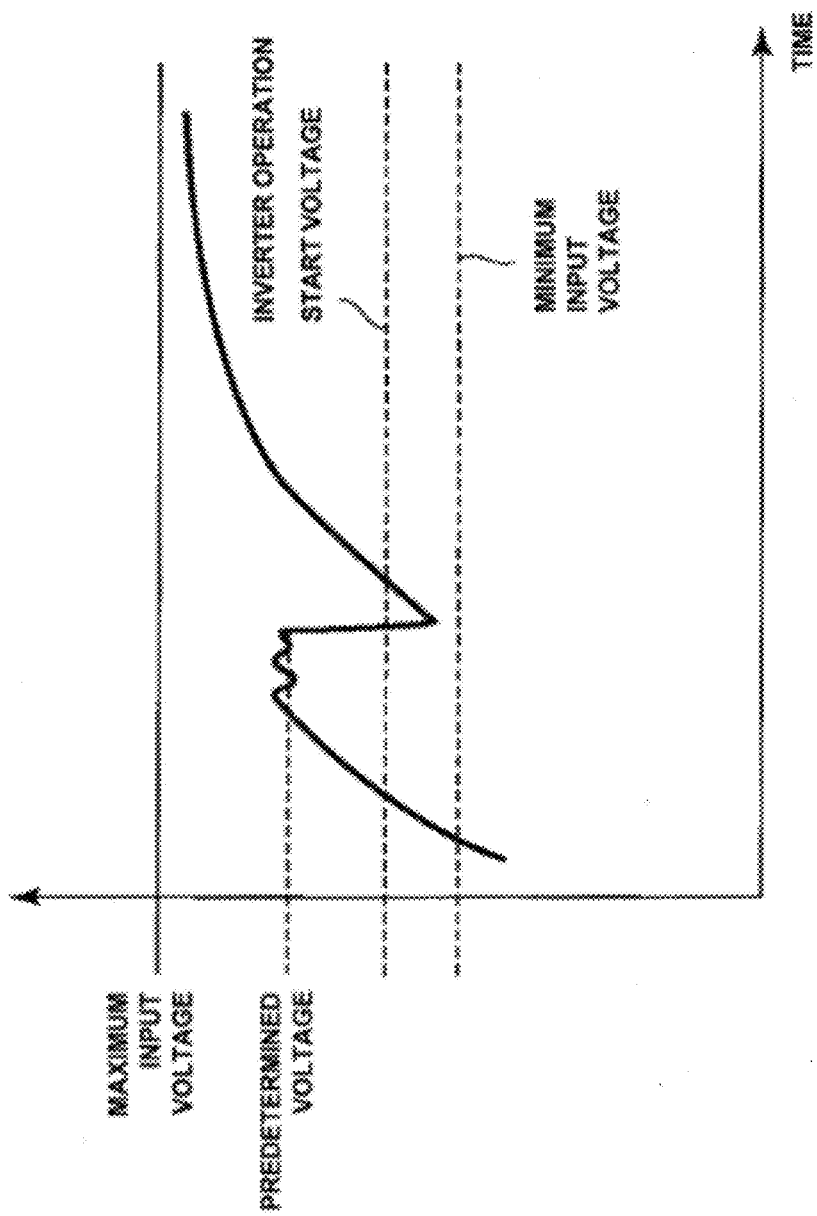
FIG. 24 is a figure illustrating a transition of a voltage output from a solar battery panel.

FIG. 24 is a figure illustrating a transition of the voltage output from the solar battery panel. The open-circuit voltage of the solar battery panel 2 increases as the time passes since the sunlight is incident onto the solar battery panel 2. The calculation control device 4 changes the degree of opening of the solar battery panel sunlight transmission amount varying device 11 so that the open-circuit voltage of the solar battery panel 2 attains the predetermined voltage. In this case, the predetermined voltage is set higher than the inverter operation start voltage. However, the inverter 6 does not immediately start the operation as soon as the open-circuit voltage exceeds the start voltage. The inverter 6 starts the operation after a predetermined time passes (for example, several dozen minutes). Therefore, the calculation control device 4 continues the control so that the open-circuit voltage attains the predetermined voltage until the inverter 6 starts the operation.

When the inverter 6 starts the operation, the load is applied, which reduces the voltage output from the solar battery panel. Thereafter, a load control function of the inverter 8 controls the voltage of the solar battery panel 2 so that the power generated by the solar battery increases. Therefore, an increase of the open-circuit voltage of the solar battery panel is suppressed. As described above, there is an effect of suppressing the increase of the string voltage 8 after the inverter 6 starts the operation. As can be seen from the above, the open-circuit voltage is prevented from exceeding the breakdown voltage by controlling the degree of opening of the shielded area so that the voltage immediately before the start of the operation of the inverter 6 attains the predetermined voltage.

In this example, the predetermined voltage is set as a value equal to or more than the inverter operation start voltage but less than the breakdown voltage. However, the application of the open-circuit voltage control system is not limited to the inverter 6. The open-circuit voltage control system can be applied to any load in general. In this case, the above predetermined voltage corresponds to a voltage set equal to or more than a voltage at which the load can operate but less than the breakdown voltage.

Control methods such as PID feedback control, sampling control, and sampling PI control, may be used as the control operation executed by the calculation control device 4. Alternatively, preset control may be used by using the characteristics as illustrated in FIG. 5 which is unique to the photovoltaic power system.

For example, a temperature sensor (not illustrated) may be arranged in a central portion of the solar battery panel 2 to measure a representing cell temperature. The calculation control device 4 identifies a characteristic curve of FIG. 5 from the cell temperature measured by the temperature sensor. Then, the calculation control device 4 finds the amount of current sunlight X, which is incident onto the solar battery panel 2, by looking up a point on the characteristic curve at the measured open-circuit voltage measured by the open-circuit voltage measurement device 3. Subsequently, the calculation control device 4 calculates the amount of sunlight Y at which the open-circuit voltage attains the predetermined voltage, and controls the degree of opening so that the degree of opening becomes Y/X times larger than the current degree of opening.

FIG. 6 is a figure illustrating a result obtained by applying the open-circuit voltage control system according to the first embodiment. The amount of sunlight is 1000 (W/m$^2$). The direction of the solar battery panel is south. A transmitted sunlight ratio of the sunlight transmission amount varying device is 100% (no shielding) in a case A and is 10% in a case B. The open-circuit voltage of a solar battery is 44 V in the case A and is 39 V in the case B.

The open-circuit voltage per string is calculated from the open-circuit voltage of the solar battery and the number of solar batteries connected in series per string.

In the case A, the sunlight incident onto the solar battery is 1000 W/m$^2$, the cell temperature is −20 C, and the number of solar batteries connected in series per string is 15. Accordingly, the open-circuit voltage per string is 660 V. Therefore, when the breakdown voltage of the photovoltaic power system is 600 V, this open-circuit voltage exceeds the breakdown voltage. On the other hand, in the case B, the transmitted sunlight ratio of the sunlight transmission amount varying device is controlled to be 10%, whereby the open-circuit voltage per string attains 585 V. Therefore, this open-circuit voltage is kept within the breakdown voltage of 600 V of the photovoltaic power system.

In the flowchart of FIG. 4, the control operation is not performed when the open-circuit voltage is equal to or less than the predetermined voltage in step S03. In this case, however, the amount of sunlight may be increased.

Second Embodiment

In a second embodiment, a solar battery panel direction varying device 12 is used as a drive control device 1, and an open-circuit voltage is adjusted by varying a direction of a solar battery panel.

Figure 7:
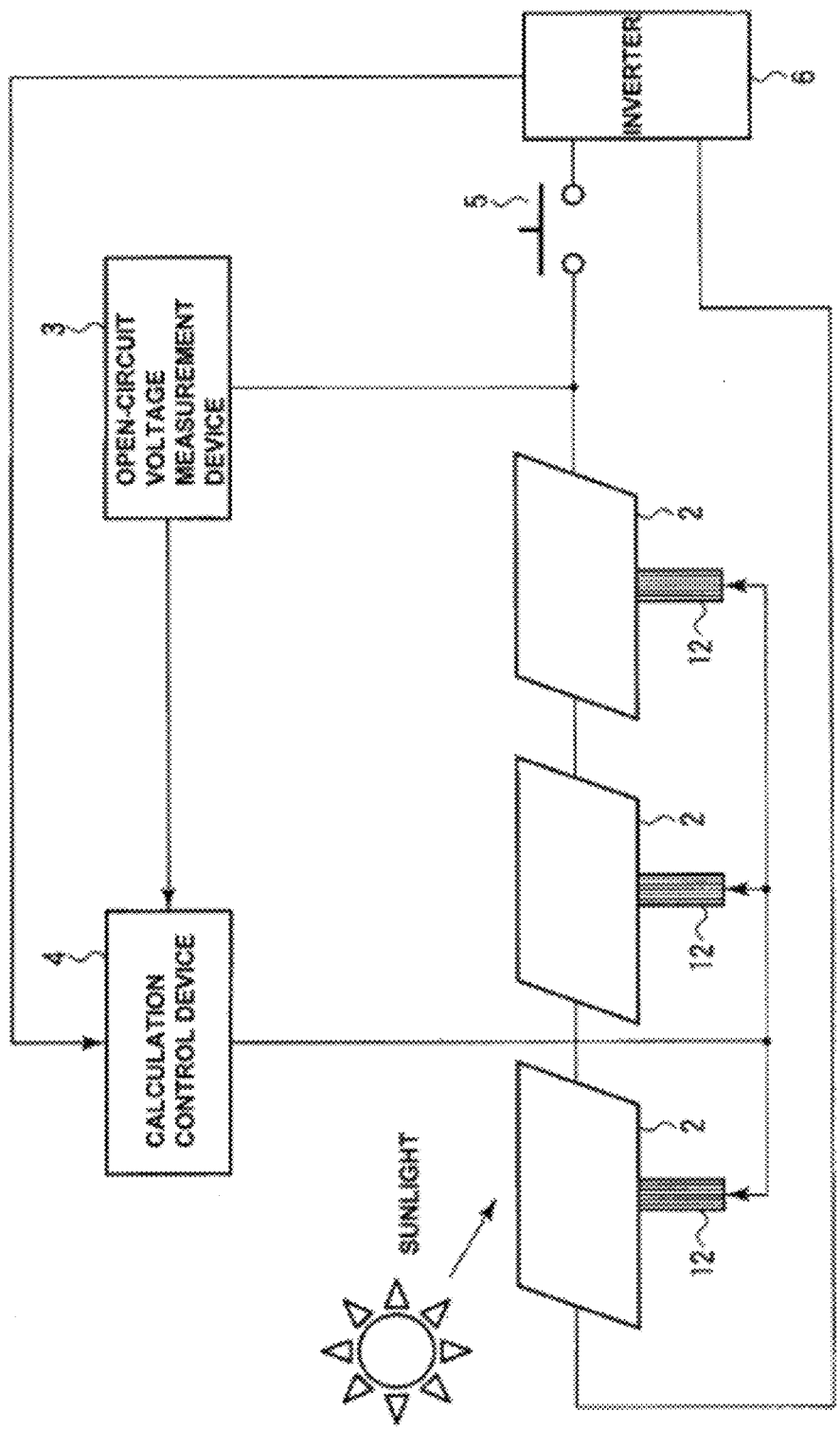
FIG. 7 is a figure illustrating a photovoltaic power system using an open-circuit voltage control system according to a second embodiment.

FIG. 7 is a figure illustrating a photovoltaic power system using the open-circuit voltage control system 10 according to the second embodiment. The photovoltaic power system includes a solar battery panel 2, an open-circuit voltage measurement device 3, a calculation control device 4, a solar battery panel direction varying device 12, a switch 5, and an inverter 6. The solar battery panel direction varying device 12 adjusts the amount of sunlight facing the solar battery panel. Description about devices other than the solar battery panel direction varying device 12 will not be repeated.

FIG. 8 is a side view and back view illustrating the solar battery panel direction varying device 12 according to the second embodiment. The solar battery panel direction varying device 12 changes the direction of the solar battery panel 2 for converting energy of sunlight into electric energy. The solar battery panel direction varying device 12 includes an azimuth angle varying device 22 for controlling an azimuth angle and an elevation angle varying device 21. Further, the solar battery panel direction varying device 12 is installed on a foundation 23 serving as a basis. The solar battery panel direction varying device 12 receives a control signal, and accordingly, the solar battery panel direction varying device 12 can adjust the amount of sunlight incident onto the solar battery panel 2.

Figure 9:
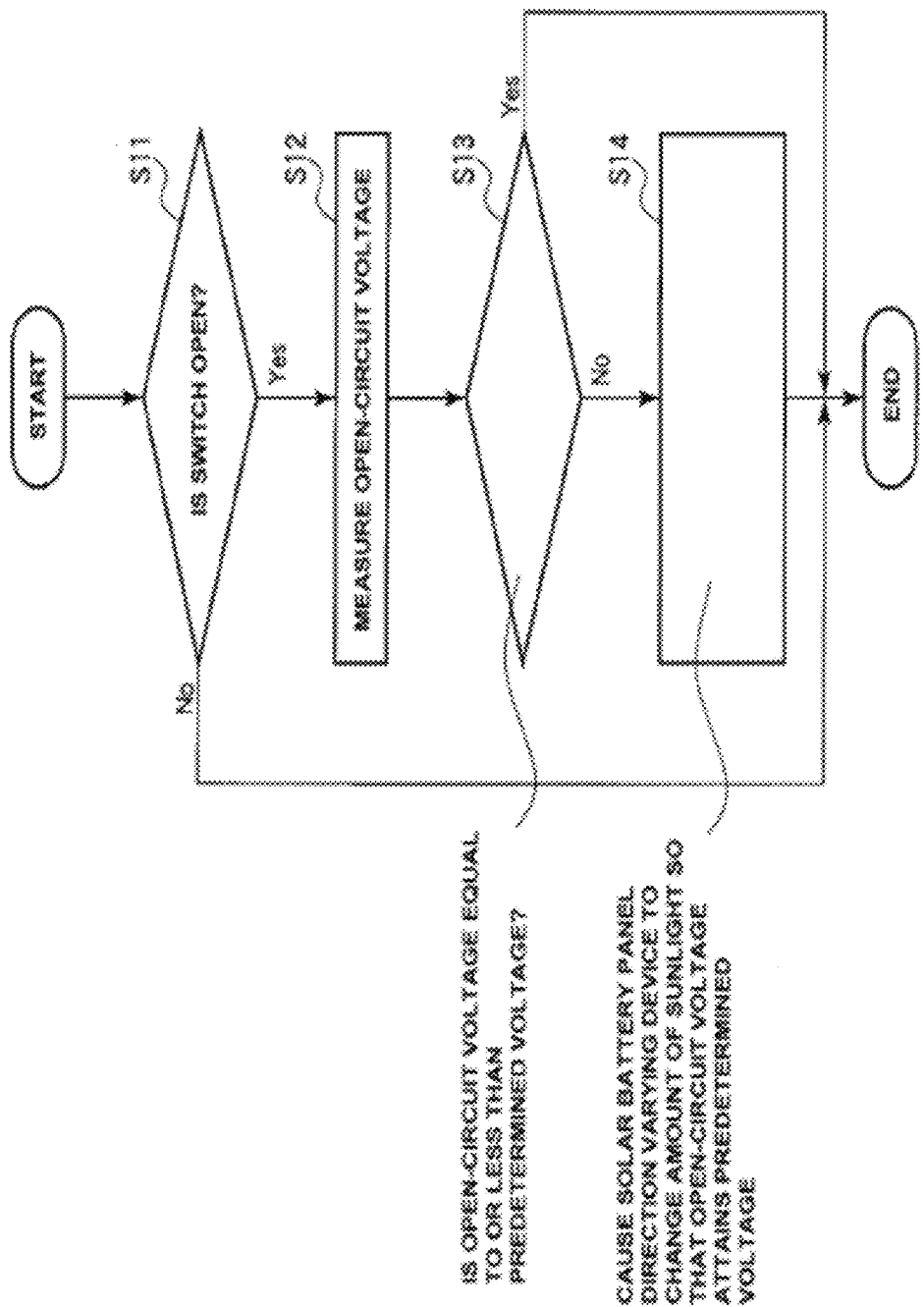
FIG. 9 is a flowchart illustrating an overview of a procedure of processing performed by a calculation control device according to the second embodiment.

FIG. 9 is a flowchart illustrating an overview of a procedure of processing performed by the calculation control device 4 according to the second embodiment. The calculation control device 4 executes the operation as illustrated in this flowchart with a predetermined interval.

In step S11, the calculation control device 4 determines whether the switch 5 is open based on a signal given by the inverter 6.

When the switch 5 is closed (No in step S11), the calculation control device 4 terminates the operation. When the switch 5 is open (Yes in step S11), the calculation control device 4 receives the open-circuit voltage measured by the open-circuit voltage measurement device 3 in step S12.

In step S13, the calculation control device 4 checks whether the open-circuit voltage is equal to or less than a predetermined voltage. In this case, the predetermined voltage is equal to or more than a voltage at which the load of the inverter 6 can operate but is less than the breakdown voltage of the photovoltaic power system, the details of which have already been described and will not be repeated here. When the open-circuit voltage is equal to or less than the predetermined voltage (Yes in step S13), the calculation control device 4 terminates the operation. When the open-circuit voltage exceeds the predetermined voltage (No in step S13), the calculation control device 4 changes the direction of the solar battery panel direction varying device 12 so that the open-circuit voltage attains the predetermined voltage in step S14.

The direction of radiation of the sun at the location where the solar battery panel direction varying device 12 is installed is determined if the current date and time are known. The direction of the solar battery panel direction varying device 12 is changed so as to reduce the amount of radiation of the sun to a predetermined value based on a database about the direction of radiation of the sun previously generated. In this case, both of the azimuth angle varying device 22 and the elevation angle varying device 21 can be operated. Alternatively, one of them may be operated, and when insufficient, the other of them may be operated in addition.

FIG. 10 is a figure illustrating a result obtained by applying the open-circuit voltage control system according to the second embodiment. In a case A, the amount of sunlight is 1000 (W/m$^2$), the direction of the solar battery panel is the direction of sunlight, and the transmitted sunlight ratio of the sunlight transmission amount varying device is 100%. In a case C, the amount of sunlight is 100 (W/m$^2$), the direction of the solar battery panel 2 is in the direction opposite to the direction of the sunlight, and the transmitted sunlight ratio is 100%. The open-circuit voltage of the solar battery is 44 V in the case A and is 39 V in the case C.

The open-circuit voltage per string is calculated from the open-circuit voltage of the solar battery and the number of solar batteries connected in series per string.

In the case A, the sunlight incident onto the solar battery is 1000 W/m$^2$, the cell temperature is −20° C., and the number of solar batteries connected in series per string is 15. Accordingly, the open-circuit voltage per string is 660 V. Therefore, when the breakdown voltage of the photovoltaic power system is 600 V, this open-circuit voltage exceeds the breakdown voltage. On the other hand, in the case B, the solar battery panel direction varying device 12 controls the amount of sunlight so that the amount of sunlight becomes 100 W/m$^2$, whereby the open-circuit voltage per string attains 585 V.

Therefore, this open-circuit voltage is kept within the breakdown voltage of 600 V of the photovoltaic power system.

In the flowchart of FIG. 9, the control operation is not performed when the open-circuit voltage is equal to or less than the predetermined voltage in step S13. In this case, however, the amount of sunlight may be increased.

Third Embodiment

In a third embodiment, a solar battery panel direction varying device 12 is used as a drive control device 1, and an open-circuit voltage is adjusted by varying a temperature of a solar battery panel.

Figure 11:
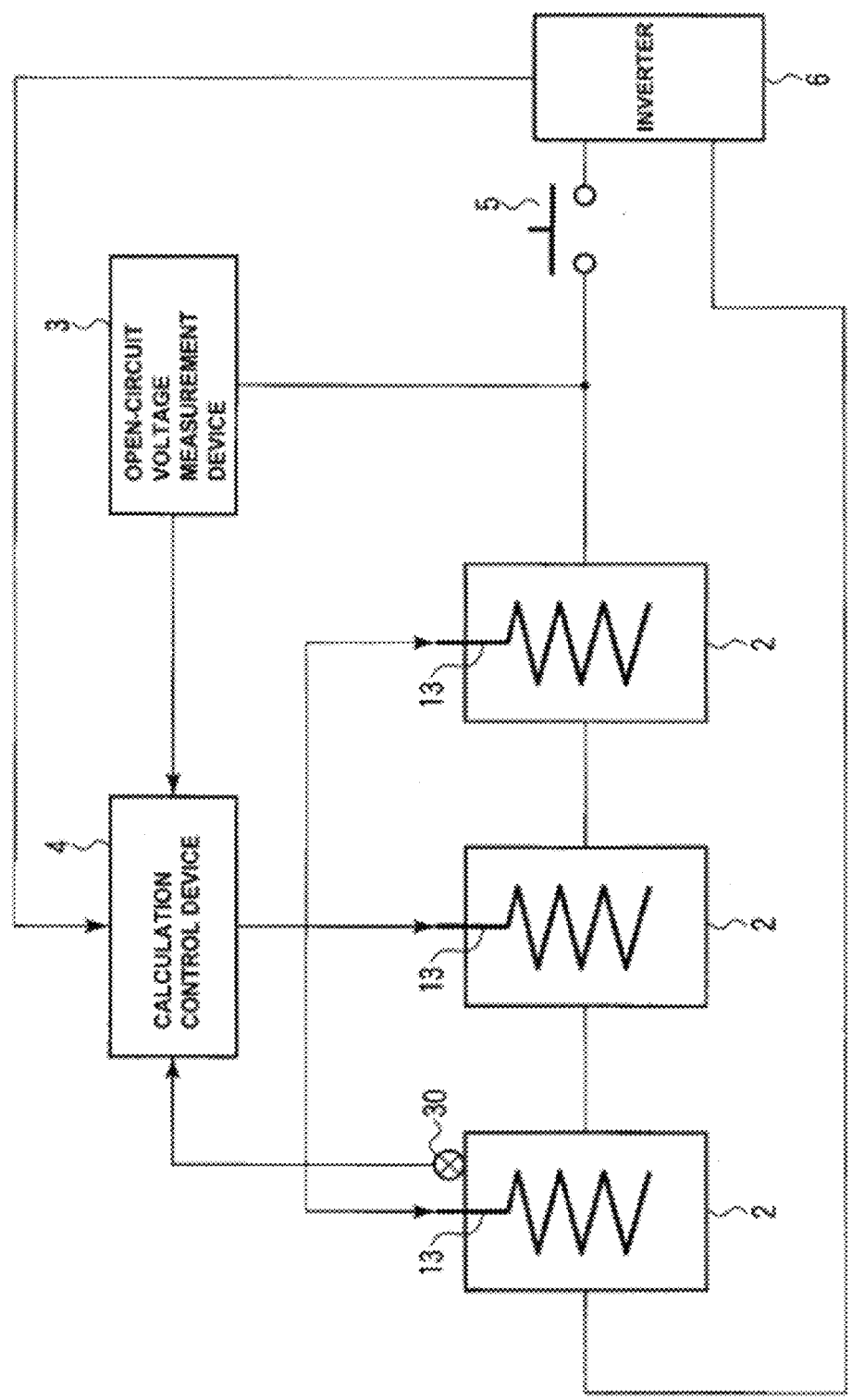
FIG. 11 is a figure illustrating a photovoltaic power system using an open-circuit voltage control system according to a third embodiment.

FIG. 11 is a figure illustrating a photovoltaic power system using an open-circuit voltage control system 10 according to the third embodiment. The photovoltaic power system includes a solar battery panel 2, an open-circuit voltage measurement device 3, a calculation control device 4, a solar battery panel temperature varying device 13, a temperature sensor 30, a switch 5, and an inverter 6. The solar battery panel temperature varying device 13 is installed adjacent to the solar battery panel 2 to adjust a panel temperature. The temperature sensor 30 is arranged in a central portion of the solar battery panel, and the measured value thereof is adopted as a cell temperature. Description about devices other than the solar battery panel temperature varying device 13 and the temperature sensor 30 will not be repeated.

Figure 12:
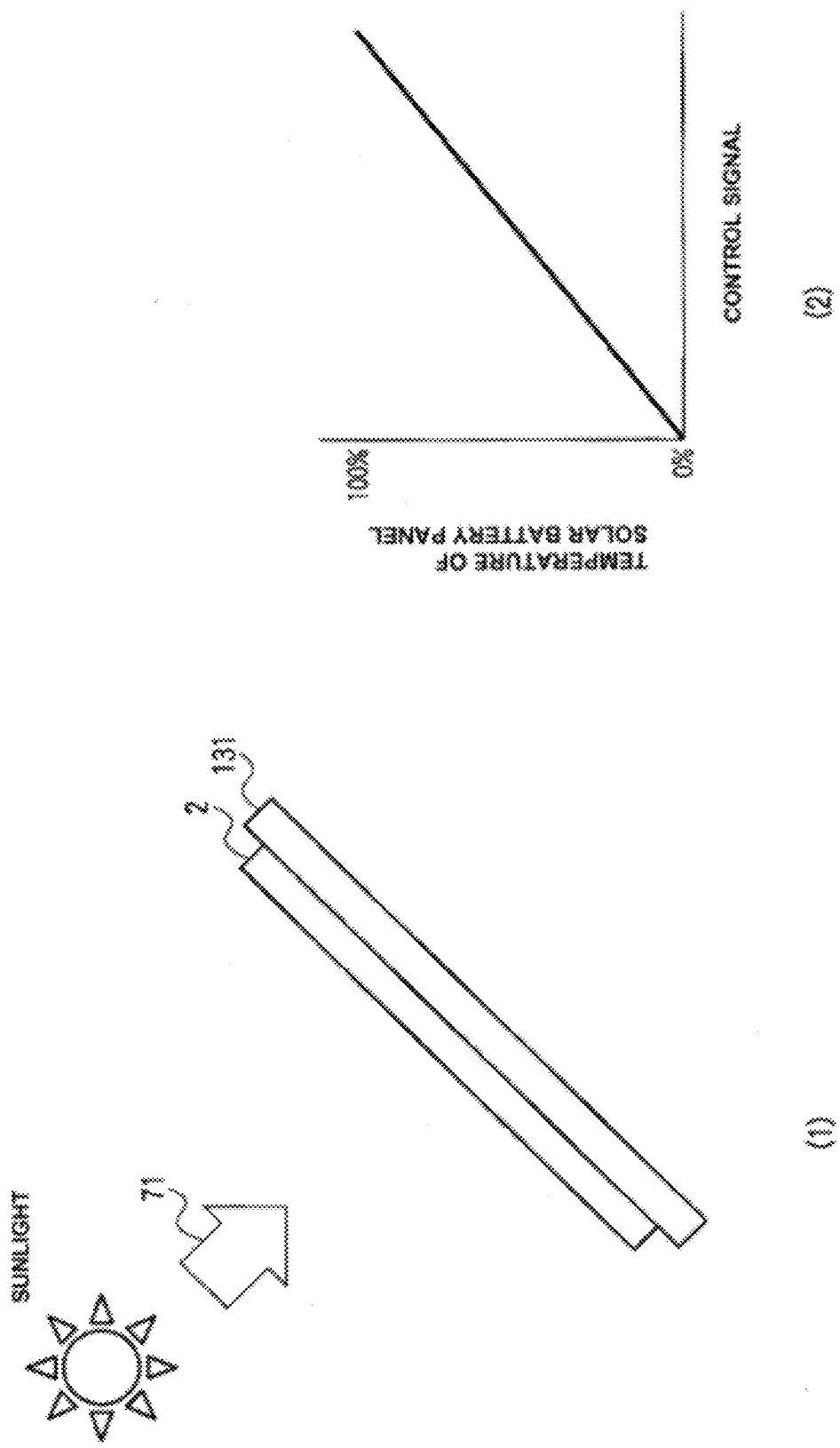
FIG. 12 is a figure illustrating an operation of a solar battery panel temperature varying device according to the third embodiment.

FIG. 12 is a figure illustrating an operation of the solar battery panel temperature varying device 13 according to the third embodiment. As illustrated in FIG. 12(1), for example, a heating wire 131 is used as the solar battery panel temperature varying device 13, and as illustrated in FIG. 12(2), an electric current signal is given as a control signal, whereby the cell temperature of the solar battery panel 2 can be controlled. Alternatively, the cell temperature may be adjusted using hot water instead of the heating wire 131 as the unit for changing the cell temperature of the solar battery panel 2.

Figure 13:
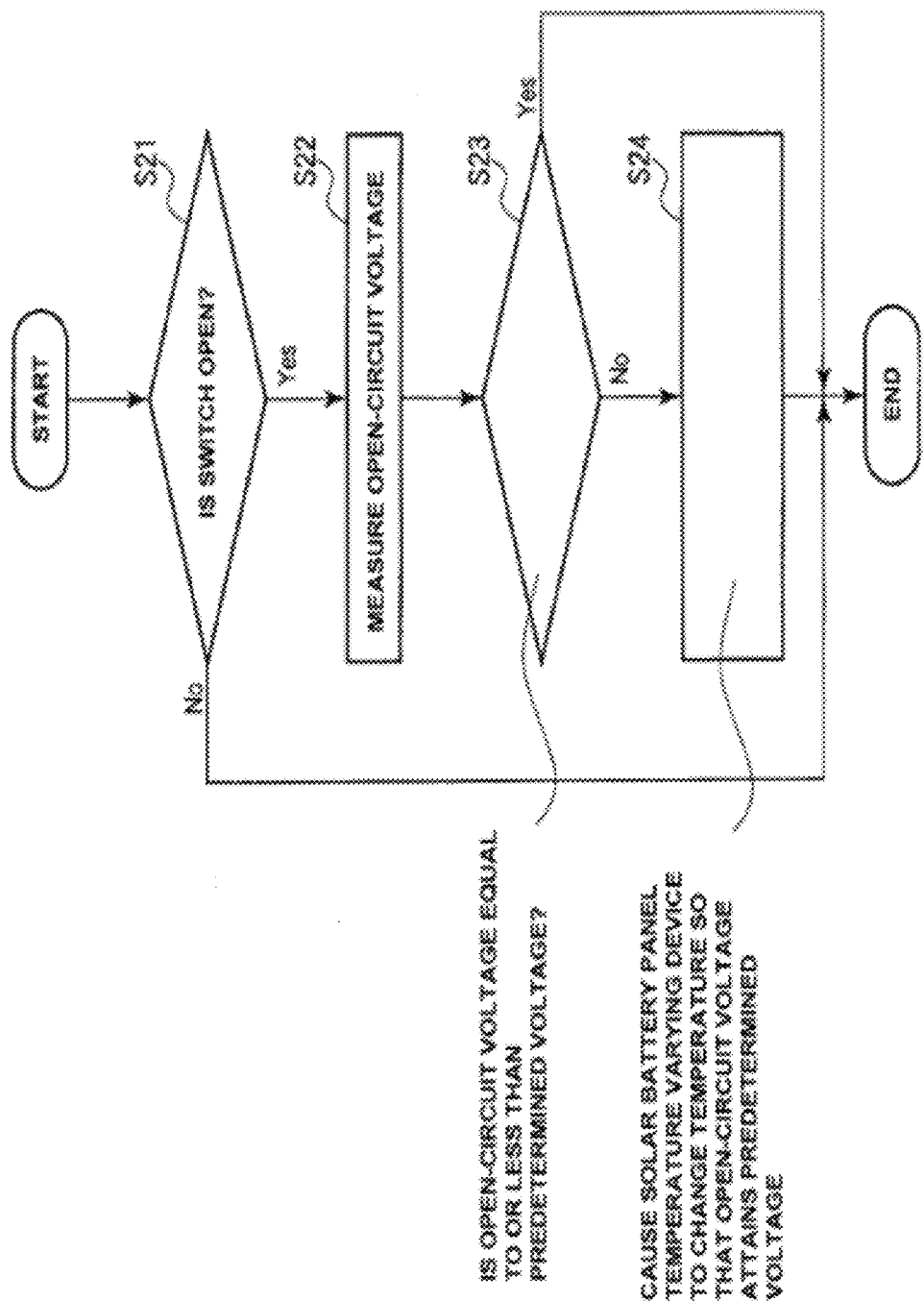
FIG. 13 is a flowchart illustrating an overview of a procedure of processing performed by a calculation control device according to the third embodiment.

FIG. 13 is a flowchart illustrating an overview of a procedure of processing performed by the calculation control device 4 according to the third embodiment. The calculation control device 4 executes the operation as illustrated in this flowchart with a predetermined interval.

In step S21, the calculation control device 4 determines whether the switch 5 is open based on a signal given by the inverter 6.

When the switch 5 is closed (No in step S21), the calculation control device 4 terminates the operation. When the switch 5 is open (Yes in step S21), the calculation control device 4 receives the open-circuit voltage measured by the open-circuit voltage measurement device 3 in step S22.

In step S23, the calculation control device 4 checks whether the open-circuit voltage is equal to or less than a predetermined voltage. In this case, the predetermined voltage is equal to or more than a voltage at which the load of the inverter 6 can operate but is less than the breakdown voltage of the photovoltaic power system, the detailed description about which is not given here. When the open-circuit voltage is equal to or less than the predetermined voltage (Yes in step S23), the calculation control device 4 terminates the operation. When the open-circuit voltage exceeds the predetermined voltage (No in step S23), the calculation control device 4 causes the solar battery panel temperature varying device 13 to change the temperature of the solar battery panel 2 so that the open-circuit voltage attains the predetermined voltage in step S24.

Each method described in the first embodiment can be used as the control method for the third embodiment. For example, the control may be performed as follows.

Figure 14:
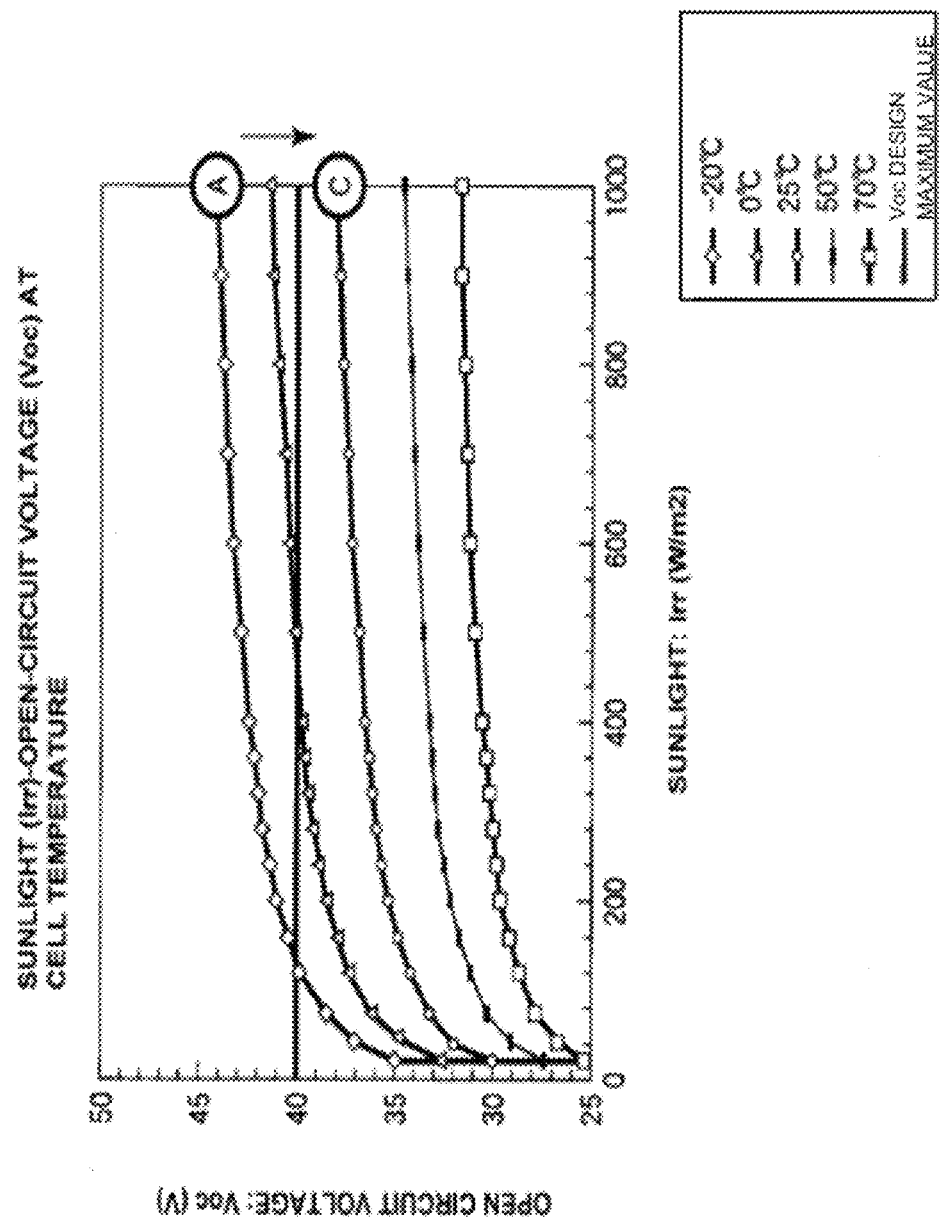
FIG. 14 is a graph illustrating a relationship between an open-circuit voltage and the amount of sunlight at each cell temperature of a solar battery panel.

FIG. 14 is a graph illustrating a relationship between an open-circuit voltage and the amount of sunlight at each cell temperature of a solar battery panel. As illustrated in this graph, the open-circuit voltage decreases as the amount of sunlight decreases. On the other hand, the open-circuit voltage decreases as the cell temperature increases. In the graph, the cell voltage value corresponding to the breakdown voltage value of the open-circuit voltage is represented as 40 V.

The calculation control device 4 identifies a characteristic curve of FIG. 14 from the cell temperature measured by the temperature sensor 30. Then, the calculation control device 4 finds the amount of current sunlight, which is incident onto the solar battery panel 2, by looking up a point on the characteristic curve at the measured open-circuit voltage measured by the open-circuit voltage measurement device 3. Then, the calculation control device 4 calculates such a target cell temperature that the open-circuit voltage attains a predetermined voltage under the amount of sunlight, and the solar battery panel temperature varying device 13 performs control to attain the target cell temperature.

FIG. 15 is a figure illustrating a result obtained by applying the open-circuit voltage control system according to the third embodiment. In a case A, the amount of sunlight is 1000 (W/m$^2$), the direction of the solar battery panel is south, and the transmitted sunlight ratio of the sunlight transmission amount varying device is 100%. The open-circuit voltage of the solar battery is 44 V in the case A.

The open-circuit voltage per string is calculated from the open-circuit voltage of the solar battery and the number of solar batteries connected in series per string. In the case A, the sunlight incident onto the solar battery is 1000 W/m$^2$, the cell temperature is −20° C., and the number of solar batteries connected in series per string is 15. Accordingly, the open-circuit voltage per string is 660 V. Therefore, when the breakdown voltage of the photovoltaic power system is 600 V, this open-circuit voltage exceeds the breakdown voltage.

On the other hand, in a case D, the amount of sunlight is 1000 (W/m$^2$), the direction of the solar battery panel is south, and the transmitted sunlight ratio of the sunlight transmission amount varying device is 100%, which are the same as the case A. The solar battery panel temperature varying device 13 controls the cell temperature at 25° C., whereby the open-circuit voltage per string is 570 V, which is kept within the breakdown voltage of 600V of the photovoltaic power system.

Fourth Embodiment

In a fourth embodiment, an open-circuit voltage is adjusted by varying the number of connected solar battery panels constituting a circuit as a drive control device 1.

Figure 16:
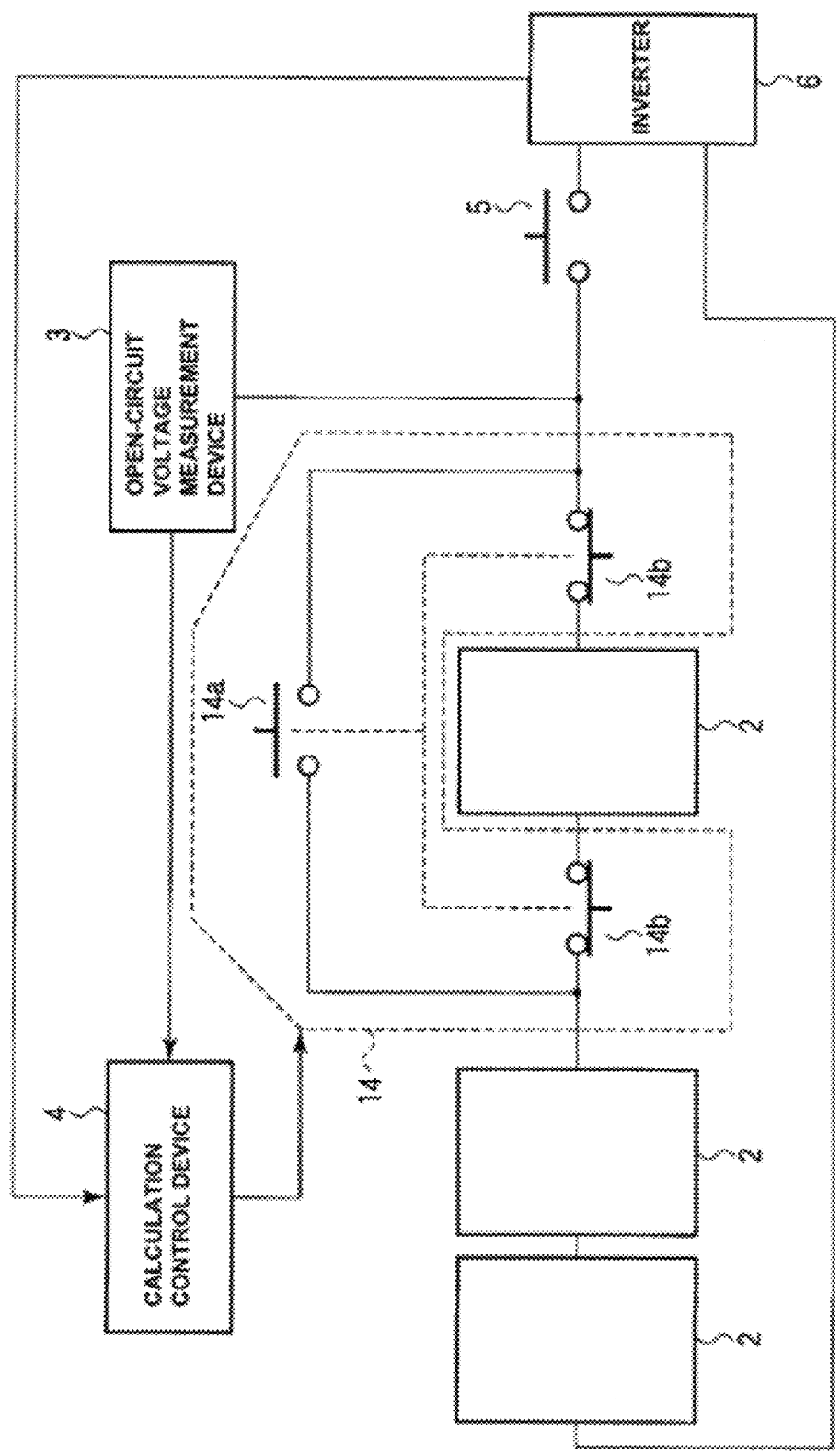
FIG. 16 is a figure illustrating a photovoltaic power system using an open-circuit voltage control system according to a fourth embodiment.

FIG. 16 is a figure illustrating a photovoltaic power system using an open-circuit voltage control system 10 according to the fourth embodiment. The photovoltaic power system includes a solar battery panel 2, an open-circuit voltage measurement device 3, a calculation control device 4, a circuit varying device 14, a switch 5, and an inverter 6. The circuit varying device 14 changes the number of solar battery panels connected to one string.

Figure 17:
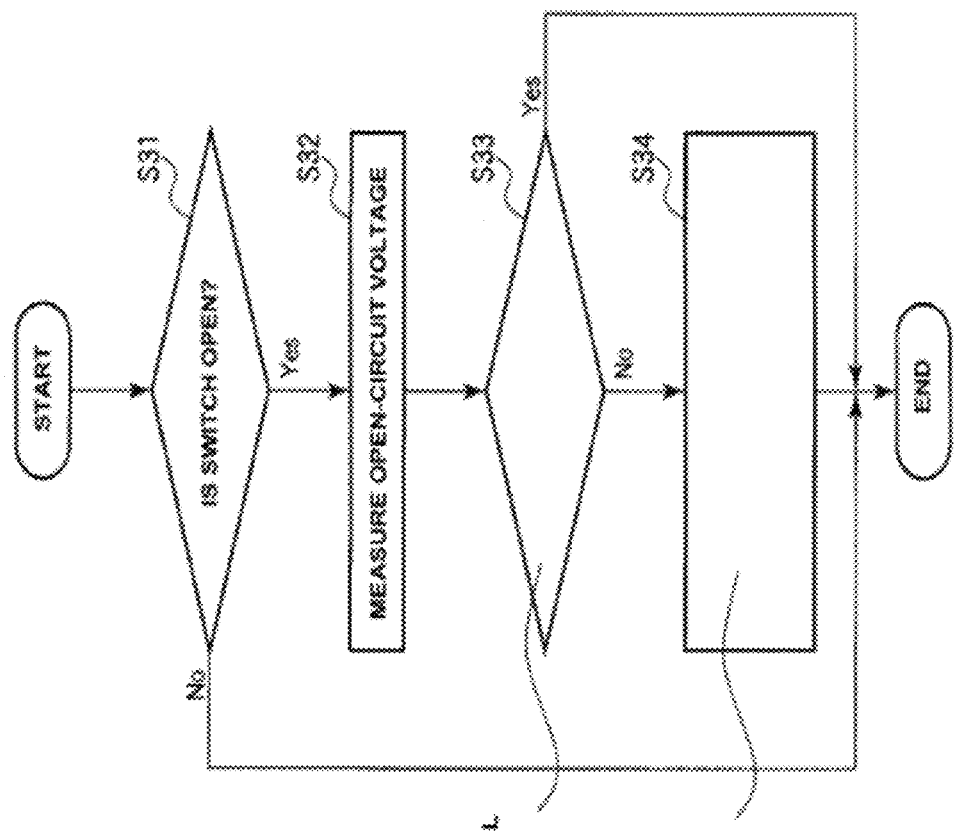
FIG. 17 is a flowchart illustrating an overview of a procedure of processing performed by a calculation control device according to the fourth embodiment.

FIG. 17 is a flowchart illustrating an overview of a procedure of processing performed by a calculation control device 4 according to the fourth embodiment. The calculation control device 4 executes the operation as illustrated in this flowchart with a predetermined interval.

In step S31, the calculation control device 4 determines whether the switch 5 is open based on a signal given by the inverter 6.

When the switch 5 is closed (No in step S31), the calculation control device 4 terminates the operation. When the switch 5 is open (Yes in step S31), the calculation control device 4 receives the open-circuit voltage measured by the open-circuit voltage measurement device 3 in step S32.

In step S33, the calculation control device 4 checks whether the open-circuit voltage is equal to or less than a predetermined voltage. In this case, the predetermined voltage is equal to or more than a voltage at which the load of the inverter 6 can operate but is less than the breakdown voltage of the photovoltaic power system, the detailed description about which is the same as the first embodiment and will not be repeated here. When the open-circuit voltage is equal to or less than the predetermined voltage (Yes in step S33), the calculation control device 4 terminates the operation. When the open-circuit voltage exceeds the predetermined voltage (No in step S33), the calculation control device 4 causes the circuit varying device 14 to change the number of solar battery panels connected to one string so that the open-circuit voltage attains a voltage equal to or more than the inverter operation start voltage but less than the breakdown voltage.

For example, in a case where the open-circuit voltage exceeds the predetermined voltage, the calculation control device 4 may change (reduce) the number of the solar battery panels 2. Further, a thermometer (not illustrated) may be arranged on the solar battery panel, and the following control may be performed.

Figure 18:
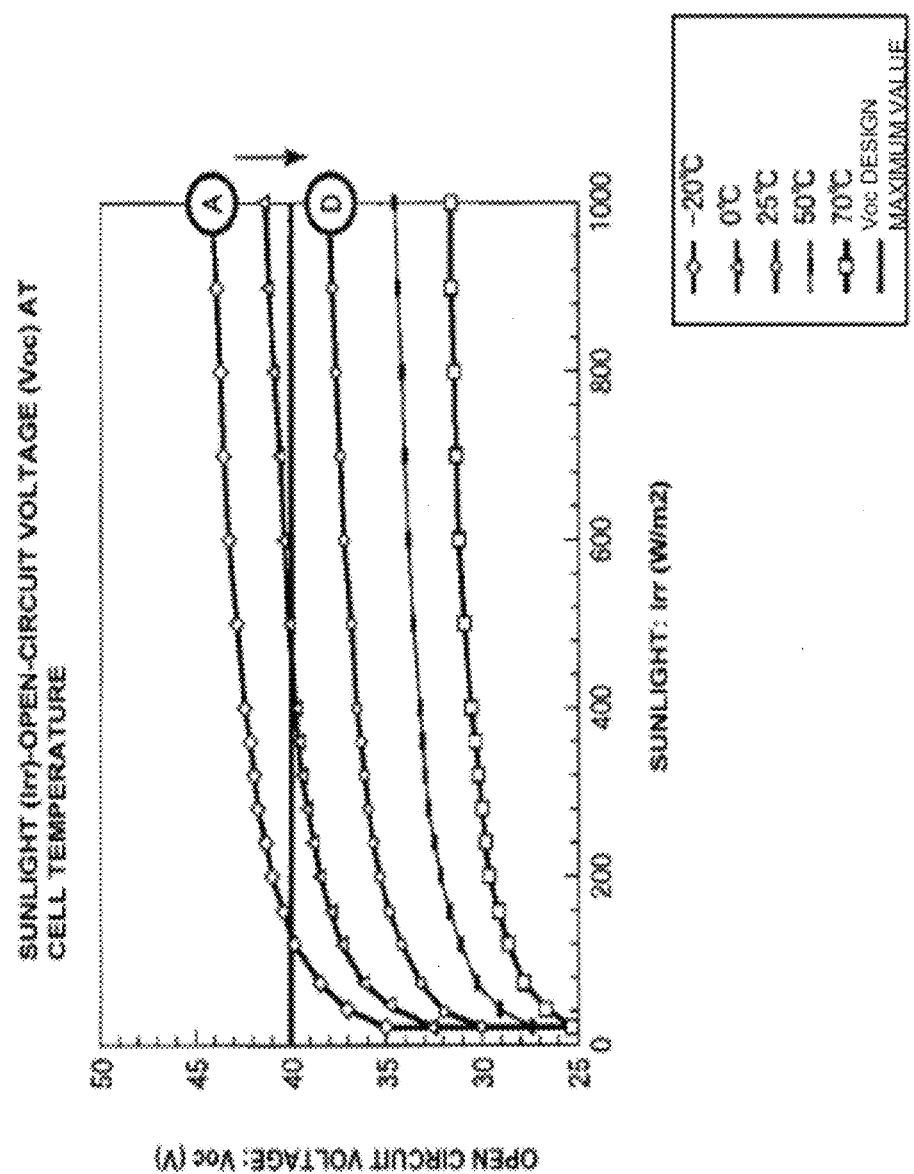
FIG. 18 is a graph illustrating a relationship between an open-circuit voltage and the amount of sunlight at each cell temperature of a solar battery panel.

FIG. 18 is a graph illustrating a relationship between an open-circuit voltage and the amount of sunlight at each cell temperature of a solar battery panel. As illustrated in this graph, the open-circuit voltage decreases as the amount of sunlight decreases. On the other hand, the open-circuit voltage decreases as the cell temperature increases. In the graph, the cell voltage value corresponding to the breakdown voltage value of the open-circuit voltage is represented as 40 V.

The calculation control device 4 identifies a characteristic curve of FIG. 18 from the cell temperature measured by the temperature sensor 30. Then, the calculation control device 4 finds the amount of current sunlight X, which is incident onto the solar battery panel 2, by looking up a point on the characteristic curve at the open-circuit voltage measured by the open-circuit voltage measurement device 3. Subsequently, the calculation control device 4 calculates the amount of sunlight Y at which the open-circuit voltage attains a predetermined voltage, and controls the number of solar battery panels connected to one string so that the number of panels becomes Y/X times larger than the current number of panels.

Figure 19:
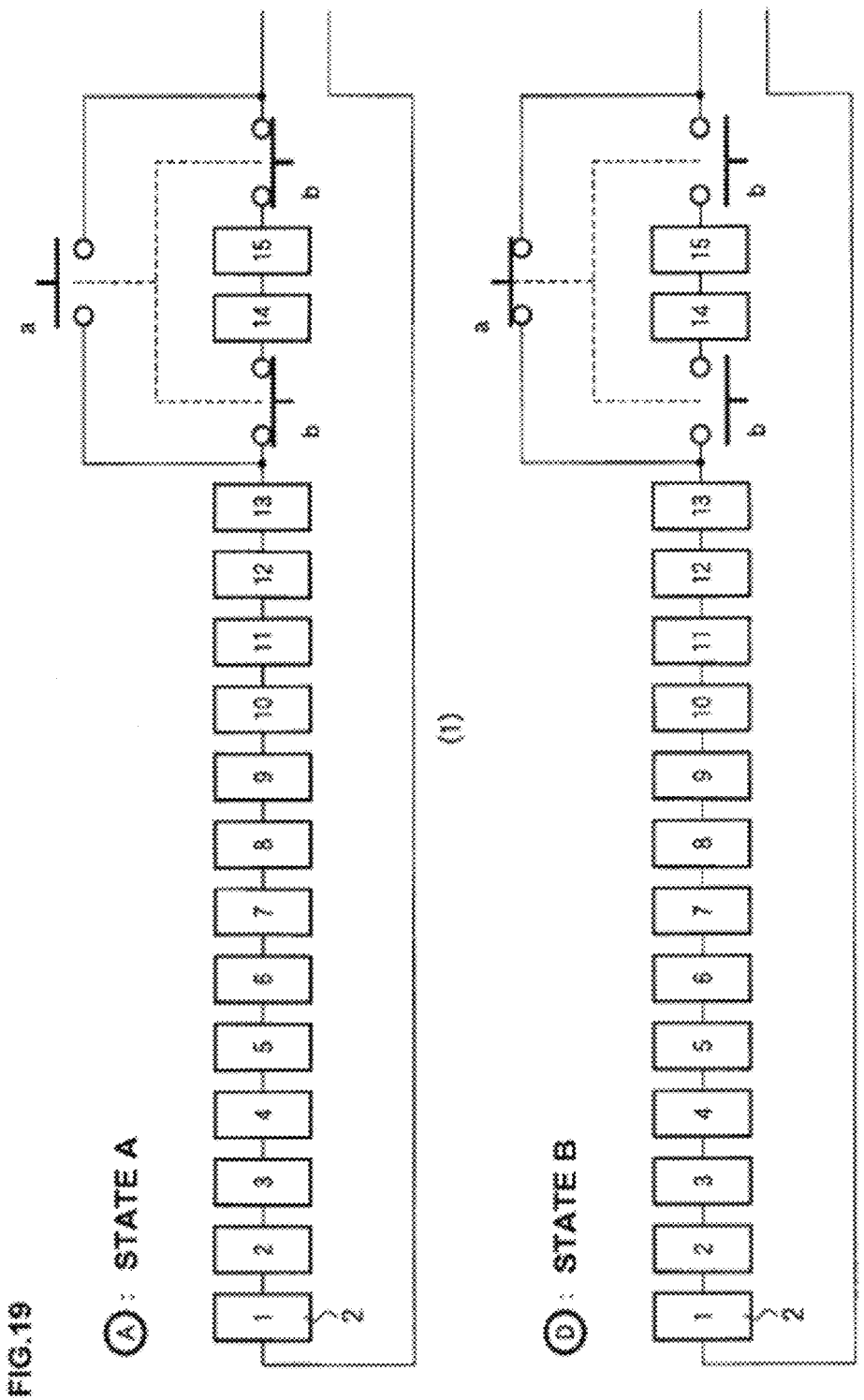
FIG. 19 is a schematic view illustrating an aspect in which the number of solar battery panels is changed by a circuit varying device.

FIG. 19 is a schematic view illustrating an aspect in which the number of solar battery panels is changed by the circuit varying device 14. FIG. 19(1) illustrates a connection state of one string before the change. Before the change, fifteen solar battery panels 2 are connected in series in one string. FIG. 19(2) illustrates a connection state of one string after the change. After the change, thirteen solar battery panels 2 are connected in series in one string.

The number of solar battery panels 2 connected/disconnected may be a fixed number (for example, 2) as illustrated in FIG. 19, or may be a variable number (for example, 1 to 3) according to a value of which the voltage is reduced. Further, the solar battery panel 2 connected/disconnected may be in any of a front portion, an intermediate portion, and a rear portion of the solar battery panels connected in series.

FIG. 20 is a figure illustrating a result obtained by applying the open-circuit voltage control system according to the fourth embodiment. In a case A, the amount of sunlight is 1000 (W/m$^2$), the direction of the solar battery panel is south, and the transmitted sunlight ratio of the sunlight transmission amount varying device is 100%. The open-circuit voltage of the solar battery is 44 V in the case A.

The open-circuit voltage per string is calculated from the open-circuit voltage of the solar battery and the number of solar batteries connected in series per string. In the case A, the sunlight incident onto the solar battery is 1000 W/m$^2$, the cell temperature is −20° C., and the number of solar batteries connected in series per string is 15. Accordingly, the open-circuit voltage per string is 660 V. Therefore, when the breakdown voltage of the photovoltaic power system is 600 V, this open-circuit voltage exceeds the breakdown voltage.

On the other hand, in a case E, the amount of sunlight is 1000 (W/m$^2$), the direction of the solar battery panel is south, and the transmitted sunlight ratio of the sunlight transmission amount varying device is 100%, which are the same as the case A. The circuit varying device 14 causes the number of solar battery panels 2 connected to one string to be 13, whereby the open-circuit voltage per string is 572 V, which is kept within the breakdown voltage of 600V of the photovoltaic power system.

In each of the above embodiments described above, the drive control device 1 uses any one of the solar battery panel sunlight transmission amount varying device 11, the solar battery panel direction varying device 12, the solar battery panel temperature varying device 13, and the circuit varying device 14. Alternatively, a plurality of devices may be combined as necessary. Still alternatively, a type of device used as the drive control device 1 may be chosen for each string.

The time when the above control operation is performed is not limited to "a time immediately before the start of the operation of the inverter 6." The same operation can be achieved even when "a string is opened" due to some reason. For example, the switch 5 may be intentionally opened for maintenance and inspection. At this occasion, the load is separated, and therefore, a voltage equal to or more than the breakdown voltage is generated from the opened string, which may damage the string 7, the solar battery panel 2, and the like. Even in such case, the open-circuit voltage control system 10 operates so that the voltage generated from the string does not become a voltage equal to or more than the breakdown voltage. On the other hand, when a connection is made after the maintenance is finished, the control operation described in each of the above embodiments is carried out. Therefore, a voltage exceeding the breakdown voltage is not exerted on the photovoltaic power system.

Variation of Embodiments

Variations of the above embodiments will be described.

In FIG. 2, the calculation control device 4 obtains information about the open/close state of the switch 5 from the inverter 6, but the present disclosure is not limited to this embodiment.

For example, the calculation control device 4 monitors the voltage measured by the open-circuit voltage measurement device 3. When the voltage rapidly drops, the load is determined to be applied to the inverter 6, and the control operation may be stopped. In other words, the calculation control device 4 determines the opening state of the switch 5 based on the voltage measured by the open-circuit voltage measurement device 3.

Further, the calculation control device 4 can obtain the open/close state of the switch 5 by receiving the state of the switch 5 as a DI (digital input) and monitoring the DI.

Further, a person may manually instruct a calculation device to stop/start control. In other words, the person may give an instruction that the switch 5 is connected/opened. Particularly, in a case where the connection between the inverter 6 and the string is disconnected for maintenance or inspection operation, and the inverter 6 and the string are placed under the control after the operation is finished, facilities can be operated flexibly. These variations of the embodiments may be used in combination with the above embodiments as necessary.

It is to be understood that the functions described in the above embodiments may be structured and achieved not only with hardware, but also with software by causing a computer to read a program in which the functions are described. Alternatively, each function may be structured by selectively using any one of software and hardware as necessary.

Therefore, the processing explained and described as the flowcharts may be structured with hardware achieving the processing.

It is to be understood that the present disclosure is not limited to the above embodiments as they are. The present disclosure can be embodied upon changing constituent elements without deviating from the gist of the present disclosure in embodiment steps.

Various kinds of disclosures can be formed by appropriate combinations of the plurality of constituent elements disclosed in the above embodiments. For example, some of the constituent elements may be deleted from the constituent elements disclosed in the embodiments. Further, constituent elements in different embodiments may be combined as necessary.

What is claimed is:

1. A system comprising:
   an open-circuit voltage measurement device for measuring an open-circuit voltage of a string of solar battery panels in a state where the string and a load are not connected;
   a sunlight amount varying device for changing an amount of sunlight incident on the solar battery panel;
   a calculation sunlight amount varying device for outputting a signal for changing the amount of sunlight incident on the solar battery panels so that the open-circuit voltage generated by the string attains a predetermined voltage, based on the open-circuit voltage measured by the open-circuit voltage measurement device when the string and the load are in an open state;
   wherein the sunlight amount varying device is a direction varying device for changing at least one of a direction and an inclination of the solar battery panel surface, and
   wherein the calculation sunlight amount varying outputs, to the direction varying device, a signal for changing the direction and the inclination of the solar battery panel surface so that the open-circuit voltage generated by the string attains the predetermined voltage, in view of a relationship between the direction of the sunlight and the open-circuit voltage based on the open-circuit voltage measured by the open-circuit voltage measurement device.

2. The system of claim 1 wherein the sunlight amount varying device is a circuit varying device for changing a number of the plurality of solar battery panels connected in series, and
   the calculation sunlight amount varying device outputs, to the circuit varying device, a signal for changing the number of solar battery panels so that the open-circuit voltage generated by the string attains the predetermined voltage equal to or more than an operable voltage of the load but not more than the breakdown voltage of the solar battery panels, in view of a relationship between the number of solar battery panels connected in series and the open-circuit voltage based on the open-circuit voltage measured by the open-circuit voltage measurement device.

3. The system of claim 1 further comprising a thermometer for measuring a cell temperature of the solar battery panel, wherein
   the calculation sunlight amount varying outputs, to the sunlight amount varying device, a signal for changing the amount of sunlight so that the open-circuit voltage generated by the string attains the predetermined voltage, in view of a relationship between the sunlight and the open-circuit voltage at the cell temperature based on the cell temperature and the open-circuit voltage measured by the open-circuit voltage measurement device.

4. A method comprising:
   measuring an open-circuit voltage of a string of solar battery panels in an open state where the string and a load are not connected;
   controlling an output voltage of the solar battery panels by changing an amount of sunlight incident onto the solar battery panels so that the open-circuit voltage generated by the string attains the predetermined voltage based on the measured open-circuit voltage when the string and the load are in an open state
   wherein changing the amount of sunlight incident onto the solar battery panels comprises changing the direction and the inclination of the solar battery panels surface in view of a predetermined relationship between the direction and inclination of the solar battery panels and the open-circuit voltage.

5. The method of claim 4 further comprising:
   measuring a temperature of the solar battery panel; and
   changing a cell temperature so that the open-circuit voltage generated by the string attains the predetermined voltage in view of a predetermined relationship between the cell temperature and the open-circuit voltage.

6. The method of claim 4 further comprising:
   changing a number of solar battery panels connected in series, so that the open-circuit voltage generated by the string attains the predetermined voltage equal to or more than the operable voltage of the load but not more than the breakdown voltage of the solar battery panels, in view of a predetermined relationship between the number of solar battery panels connected in series and the open-circuit voltage.

7. A system comprising:
   a voltage detector operable measuring an open-circuit voltage of a string of solar battery panels in a state where the string and a load are not connected;
   a sunlight amount varying device for changing an amount of sunlight incident on the solar battery panels operable to control an output voltage of the solar battery panels so that the open-circuit voltage attains a predetermined voltage equal to or more than an operable voltage of the load but not more than a breakdown voltage of the solar battery panels, based on the open-circuit voltage measured by the voltage detector when the string and the load are in an open state;
   wherein the sunlight amount varying device is further operable to change at at least one of a direction and an inclination of the solar battery panel surface, and wherein the computer is further operable to output, to the sunlight amount varying device, a signal for changing at least the direction or the inclination of the solar battery panel surface so that the open-circuit voltage generated by the string attains the predetermined voltage, in view of a predetermined relationship between the direction of the sunlight and the open-circuit voltage.

8. The system of claim 7 wherein the sunlight amount varying device is further operable to change an amount of sunlight incident onto the solar battery panels so that the open-circuit voltage generated by the string attains the predetermined voltage.

9. The system of claim 7 further comprising:
a thermometer for measuring a temperature of the solar battery panel; and
wherein the sunlight amount varying device is further operable to change the temperature of the solar battery panel so that the open-circuit voltage generated by the string attains the predetermined voltage, in view of a predetermined relationship between the cell temperature and the open-circuit voltage.

10. The system of claim 7,
wherein the sunlight amount varying device is further operable to change a number of the plurality of solar battery panels connected in series, and
the sunlight amount varying device is further operable to change the number of solar battery panels so that the open-circuit voltage generated by the string attains the predetermined voltage equal to or more than the operable voltage of the load but not more than the breakdown voltage of the solar battery panels, in view of a predetermined relationship between the number of solar battery panels connected in series and the open-circuit voltage.

11. The system of claim 7 further comprising a computer operable to output a signal to the sunlight amount varying device to control an output voltage of the solar battery panels so that the open-circuit voltage attains a predetermined voltage equal to or more than an operable voltage of the load but not more than a breakdown voltage of the solar battery panels, based on the open-circuit voltage measured by the voltage detector when the string and the load are in an open state.

* * * * *